(12) United States Patent
Ogawa

(10) Patent No.: US 7,359,263 B2
(45) Date of Patent: Apr. 15, 2008

(54) CHIP INFORMATION MANAGING METHOD, CHIP INFORMATION MANAGING SYSTEM, AND CHIP INFORMATION MANAGING PROGRAM

(75) Inventor: Sumio Ogawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 127 days.

(21) Appl. No.: 11/440,181

(22) Filed: May 25, 2006

(65) Prior Publication Data

US 2006/0268634 A1    Nov. 30, 2006

(30) Foreign Application Priority Data

May 27, 2005   (JP)   ............................. 2005-154932

(51) Int. Cl.
*G11C 7/00* (2006.01)

(52) U.S. Cl. ...................................... 365/200; 365/201

(58) Field of Classification Search ................ 365/200, 365/201, 222
See application file for complete search history.

(56) References Cited

U.S. PATENT DOCUMENTS 6,532,182 B2 *   3/2003   Ogawa et al. ............... 365/201

FOREIGN PATENT DOCUMENTS

JP    3555859 B    5/2004

* cited by examiner

*Primary Examiner*—Son Dinh
(74) *Attorney, Agent, or Firm*—McDermott Will & Emery LLP

(57) ABSTRACT

In replacing word lines having defective addresses with redundant word lines, information is held in a relationship between the word lines and the redundant word lines. In other words, information is held in a replacement rule. With this arrangement, information such as a lot number, a wafer number within the lot, and a position of a chip within the wafer can be held in the chip, without increasing the chip area at all and without using a large database.

17 Claims, 18 Drawing Sheets

| DEFECTIVE ADDRESS STORING CIRCUIT | $140_1$ | $140_2$ | $140_3$ |
|---|---|---|---|
| REDUNDANT WORD LINE | $WLR_1$ | $WLR_2$ | $WLR_3$ |
| REPLACEMENT RULE 1 | a | b | c |
| REPLACEMENT RULE 2 | a | c | b |
| REPLACEMENT RULE 3 | b | a | c |
| REPLACEMENT RULE 4 | b | c | a |
| REPLACEMENT RULE 5 | c | a | b |
| REPLACEMENT RULE 6 | c | b | a |

FIG.5

| | ALLOCATED CHARACTER | | ALLOCATED CHARACTER |
|---|---|---|---|
| REPLACEMENT RULE 1 | 0 | REPLACEMENT RULE 37 | a |
| REPLACEMENT RULE 2 | 1 | REPLACEMENT RULE 38 | b |
| REPLACEMENT RULE 3 | 2 | REPLACEMENT RULE 39 | c |
| REPLACEMENT RULE 4 | 3 | REPLACEMENT RULE 40 | d |
| REPLACEMENT RULE 5 | 4 | REPLACEMENT RULE 41 | e |
| REPLACEMENT RULE 6 | 5 | REPLACEMENT RULE 42 | f |
| REPLACEMENT RULE 7 | 6 | REPLACEMENT RULE 43 | g |
| REPLACEMENT RULE 8 | 7 | REPLACEMENT RULE 44 | h |
| REPLACEMENT RULE 9 | 8 | REPLACEMENT RULE 45 | i |
| REPLACEMENT RULE 10 | 9 | REPLACEMENT RULE 46 | j |
| REPLACEMENT RULE 11 | A | REPLACEMENT RULE 47 | k |
| REPLACEMENT RULE 12 | B | REPLACEMENT RULE 48 | l |
| REPLACEMENT RULE 13 | C | REPLACEMENT RULE 49 | m |
| REPLACEMENT RULE 14 | D | REPLACEMENT RULE 50 | n |
| REPLACEMENT RULE 15 | E | REPLACEMENT RULE 51 | o |
| REPLACEMENT RULE 16 | F | REPLACEMENT RULE 52 | p |
| REPLACEMENT RULE 17 | G | REPLACEMENT RULE 53 | q |
| REPLACEMENT RULE 18 | H | REPLACEMENT RULE 54 | r |
| REPLACEMENT RULE 19 | I | REPLACEMENT RULE 55 | s |
| REPLACEMENT RULE 20 | J | REPLACEMENT RULE 56 | t |
| REPLACEMENT RULE 21 | K | REPLACEMENT RULE 57 | u |
| REPLACEMENT RULE 22 | L | REPLACEMENT RULE 58 | v |
| REPLACEMENT RULE 23 | M | REPLACEMENT RULE 59 | w |
| REPLACEMENT RULE 24 | N | REPLACEMENT RULE 60 | x |
| REPLACEMENT RULE 25 | O | REPLACEMENT RULE 61 | y |
| REPLACEMENT RULE 26 | P | REPLACEMENT RULE 62 | z |
| REPLACEMENT RULE 27 | Q | REPLACEMENT RULE 63 | - |
| REPLACEMENT RULE 28 | R | REPLACEMENT RULE 64 | ! |
| REPLACEMENT RULE 29 | S | REPLACEMENT RULE 65 | " |
| REPLACEMENT RULE 30 | T | REPLACEMENT RULE 66 | # |
| REPLACEMENT RULE 31 | U | REPLACEMENT RULE 67 | $ |
| REPLACEMENT RULE 32 | V | REPLACEMENT RULE 68 | % |
| REPLACEMENT RULE 33 | W | REPLACEMENT RULE 69 | & |
| REPLACEMENT RULE 34 | X | REPLACEMENT RULE 70 | ( |
| REPLACEMENT RULE 35 | Y | REPLACEMENT RULE 71 | ) |
| REPLACEMENT RULE 36 | Z | REPLACEMENT RULE 72 | * |

FIG.7

CHIP INFORMATION MANAGING METHOD, CHIP INFORMATION MANAGING SYSTEM, AND CHIP INFORMATION MANAGING PROGRAM

TECHNICAL FIELD

The present invention relates to a chip information managing method, a chip information managing system, and a chip information managing program. Particularly, the present invention relates to a chip information managing method, a chip information managing system, and a chip information managing program, of a semiconductor chip having a redundant memory cell array to save a defective address.

BACKGROUND OF THE INVENTION

A semiconductor chip such as a DRAM (Dynamic Random Access Memory) is manufactured in a wafer unit by diffusion processing in a front-end process. A semiconductor wafer obtained in the front-end process is divided to produce many semiconductor chips in a post-process, as is well known. Therefore, in order to manufacture one semiconductor chip at lower cost, it is important to increase the number of semiconductor chips obtained from one semiconductor wafer and to improve productivity of the semiconductor chips obtained.

The increase in the number of semiconductor chips obtained from one semiconductor wafer can be achieved by decreasing the size of a chip area and increasing the size of a semiconductor wafer. The improvement in productivity of the semiconductor chips can be achieved by excluding various factors that degrade productivity, as far as possible, at many steps of the front-end process.

There are many complex factors that degrade productivity, and it is not always easy to pinpoint these factors. However, in a wafer state before a semiconductor wafer is divided into semiconductor chips, there are characteristics in positions where defects occur, depending on factors that degrade productivity of chips. For example, defects are concentrated at the external periphery of a semiconductor wafer, or defects are concentrated at one side of a semiconductor wafer, or a pass and a failure are repeated at every other chip. These characteristics become important keys to find factors that degrade productivity.

However, while it is relatively easy to specify a position of the occurrence of a defect in the wafer state before division into chips, it is considerably difficult to specify this position after the wafer is divided into individual chips by dicing. In order to obtain information concerning the position of the occurrence of a defect on the wafer, it is necessary to perform various operation tests to each semiconductor chip before the wafer is diced. This results in increasing the manufacturing cost of chips.

Semiconductor chips that are normal in the state before dicing will also become defective after the dicing. In this case, it is substantially impossible to obtain information concerning a position of the occurrence of the defect on the wafer.

In order to solve the above problems, Japanese Patent No. 3,555,859 discloses the following system proposed by the inventor of the present invention.

An address of a defect that occurs in a semiconductor chip which is replaced by a redundant memory cell array is stored in a database. With this arrangement, position information on the wafer can be obtained, even after the wafer is divided into individual semiconductor chips.

While many addresses of defective chips are present in a semiconductor memory such as a DRAM, defective addresses can be saved by replacing a memory cell corresponding to the defective addresses with a redundant memory cell. Because many defective addresses are saved per one semiconductor chip, a distribution of the defective addresses that have been replaced can be regarded as specific to the corresponding semiconductor chip in high probability.

Focusing attention on this point, the technique disclosed in Japanese Patent No. 3,555,859 makes it possible to obtain position information on a wafer, by storing defective addresses of each specified semiconductor chip into a database before dicing a wafer, and reading the defective addresses of the chip that has been replaced by roll calling.

As described above, according to the method disclosed in Japanese Patent Publication No. 3,555,859, a distribution of defective addresses is stored in a database, thereby making it possible to obtain position information on a wafer, without adding a special circuit to the semiconductor chip. Therefore, it is advantageous that the area of the chip is not increased.

However, the method disclosed in Japanese Patent No. 3,555,859 has a problem in that the database becomes large in proportion to the number of production of semiconductor chips. Therefore, while this problem is not so significant for a certain type of chips that are produced by a small number, the database becomes huge for types of semiconductor chips that are produced by large numbers. The huge database makes it difficult to share information. Furthermore, because a chip needs to be specified from among the huge database, a searching time becomes long, and accordingly, position information on a wafer cannot always be obtained efficiently.

According to the method disclosed in Japanese Patent No. 3,555,859, individual semiconductor chips are specified based on the distribution of defective addresses. Therefore, when the distribution of defective addresses of a certain semiconductor chip happens to be exactly the same as that of other semiconductor chip, it becomes difficult to distinguish between the two semiconductor chips.

SUMMARY OF THE INVENTION

It is, therefore, an object of the present invention to provide a chip information managing method, a chip information managing system, and a chip information managing program to be used in this method or this system, capable of making each semiconductor chip have chip information such as position information on a wafer and capable of reading this information, without increasing a chip area and without using a large database.

It is another object of the present invention to provide a chip information managing method, a chip information managing system, and a chip information managing program to be used in this method or this system, capable of obtaining chip information such as position information on a wafer from each semiconductor chip, even when there are plural semiconductor chips of which distributions of defective addresses are exactly the same.

The above and other objects of the present invention can be accomplished by a chip information management method for storing chip information into a semiconductor chip itself that includes a memory cell array having a plurality of memory cells, a plurality of defective address storing circuits each of which can store a defective address, and a redundant memory cell array that can replaces memory cells corresponding to defective addresses stored in the defective address storing circuits, the chip information management method comprising: a first step of detecting a plurality of defective addresses; a second step of determining a relationship between the plurality of defective addresses and the plurality of defective address storing circuits that store the defective addresses, based on the chip information to be stored; and a third step of storing the defective addresses in the corresponding defective address storing circuits, based on the relationship determined at the second step.

The above and other objects of the present invention can also be accomplished by a chip information management method for obtaining chip information stored in a semiconductor chip that includes a memory cell array having a plurality of memory cells, a plurality of defective address storing circuits each of which can store a defective address, and a redundant memory cell array that can replaces memory cells corresponding to defective addresses stored in the defective address storing circuits, the chip information management method comprising: a first step of reading addresses stored in the plurality of defective address storing circuits by a roll call test; a second step of specifying a replacement rule of the redundant memory cell array, by analyzing which addresses are stored in which defective address storing circuits; and a third step of specifying the chip information, based on a specified replacement rule.

A chip information management system according to one aspect of the present invention comprises: a chip information obtaining unit that obtains chip information of a semiconductor chip; and a replacement rule determining unit that determines defective address storing circuits of the semiconductor chip into which a plurality of defective addresses included in the semiconductor chip are to be stored, wherein the replacement rule determining unit differentiates a magnitude correlation of defective addresses along a layout order of the plurality of defective address storing circuits, based on the chip information obtained by the chip information obtaining unit.

A chip information management system according to another aspect of the present invention comprises: a roll call unit that reads defective addresses of a semiconductor chip, by a roll call test; and an analyzing unit that analyzes a relationship between defective addresses read out by the roll call unit and a layout order of defective address storing circuits within the semiconductor chip that stores the defective addresses, wherein the analyzing unit specifies chip information from the analyzed relationship, by referring to a data table that shows a relationship between a replacement rule according to the redundant memory cell array within the semiconductor chip and corresponding information.

A chip information management program according to one aspect of the present invention makes a computer execute a first step of obtaining chip information of a semiconductor chip, and a second step of determining defective address storing circuits of the semiconductor chip into which a plurality of defective addresses included in the semiconductor chip are to be stored, wherein at the second step, a magnitude correlation of defective addresses along a layout order of the plurality of defective address storing circuits is differentiated, based on the chip information.

A chip information management program according to another aspect of the present invention makes a computer execute a first step of reading addresses stored in defective address storing circuits within a semiconductor chip, by a roll call test; and a second step of analyzing a relationship between the addresses and a layout order of the defective address storing circuits that store the addresses, wherein at the second step, chip information is specified from the analyzed relationship, by referring to a data table that shows a relationship between a replacement rule according to the redundant memory cell array within the semiconductor chip and corresponding information.

According to one aspect of the present invention, there are provided a chip information managing method, a chip information managing system, and a chip information managing program, which make it possible to store desired information on a semiconductor chip, by only referring to a data table that allocates information to a relationship between defective addresses and a defective address storing circuit that stores these defective addresses.

According to another aspect of the present invention, there are provided a chip information managing method, a chip information managing system, and a chip information managing program, which make it possible to obtain desired information from a semiconductor chip, by only referring to a data table that allocates information to a relationship between defective addresses and a defective address storing circuit that stores these defective addresses.

As explained above, according to the present invention, a data table that allocates information to a relationship between defective addresses and a defective address storing circuit that stores these defective addresses is used. Therefore, it is not necessary to add a special circuit that stores various kinds of chip information, to a semiconductor chip. Consequently, the size of a chip area does not increase at all. Because a database that stores specific information of each semiconductor chip is not used, a data quantity of the data table to be used can be made very small. Even when there are plural semiconductor chips of which distributions of defective addresses are exactly the same, these semiconductor chips can have mutually different information.

BRIEF DESCRIPTION OF THE DRAWINGS

The above and other objects, features and advantages of this invention will become more apparent by reference to the following detailed description of the invention taken in conjunction with the accompanying drawings, wherein:

FIG. 5 is a table showing allocable combinations of defective addresses;

FIG. 7 is a table showing one example of a relationship between a replacement rule and an allocated character;

DETAILED DESCRIPTION OF THE EMBODIMENTS

Before explaining in detail preferred embodiments of the present invention, an outline configuration of a semiconductor chip to which the invention can be applied and principle of the invention are explained below.

Figure 1:
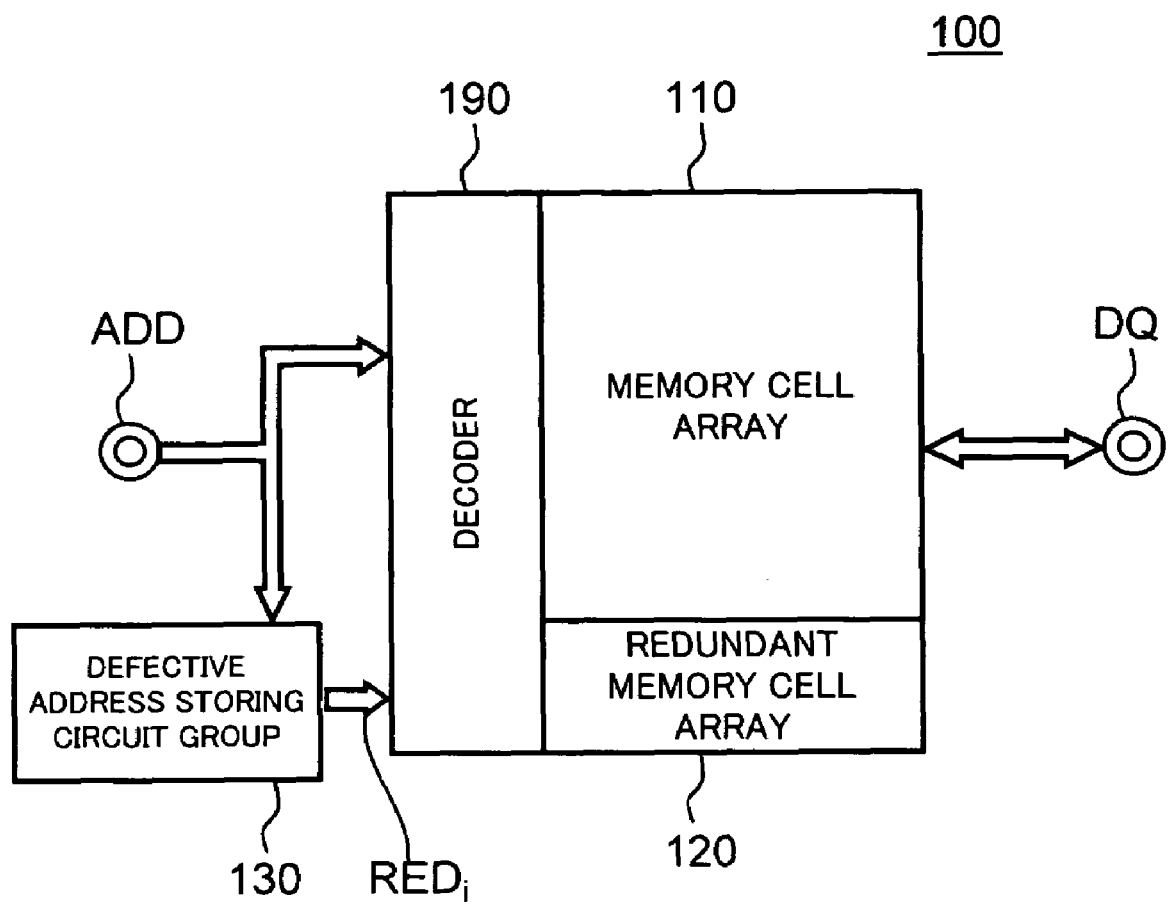
FIG. 1 is a block diagram showing key elements of a semiconductor chip to which the present invention can be applied.

FIG. 1 is a block diagram showing key elements of a semiconductor chip to which the present invention can be applied.

As shown in FIG. 1, a semiconductor chip 100 to which the present invention can be applied includes at least: a memory cell array 110 including plural memory cells; a redundant memory cell array 120 that saves defective addresses; a defective address storing circuit group 130 that stores defective addresses; and a decoder 190 that accesses the memory cell array 110 and the redundant memory cell array 120.

This semiconductor chip 100 can be a DRAM and a memory-logic integrated chip. The semiconductor chip 100 has a function of accessing a predetermined memory cell included in the memory cell array 110, based on an address signal supplied from an address terminal ADD. In a read operation, the semiconductor chip 100 outputs data stored in an accessed memory cell to a data terminal DQ. In a write operation, the semiconductor chip 100 stores data supplied from the terminal DQ into the accessed memory cell.

Figure 2:
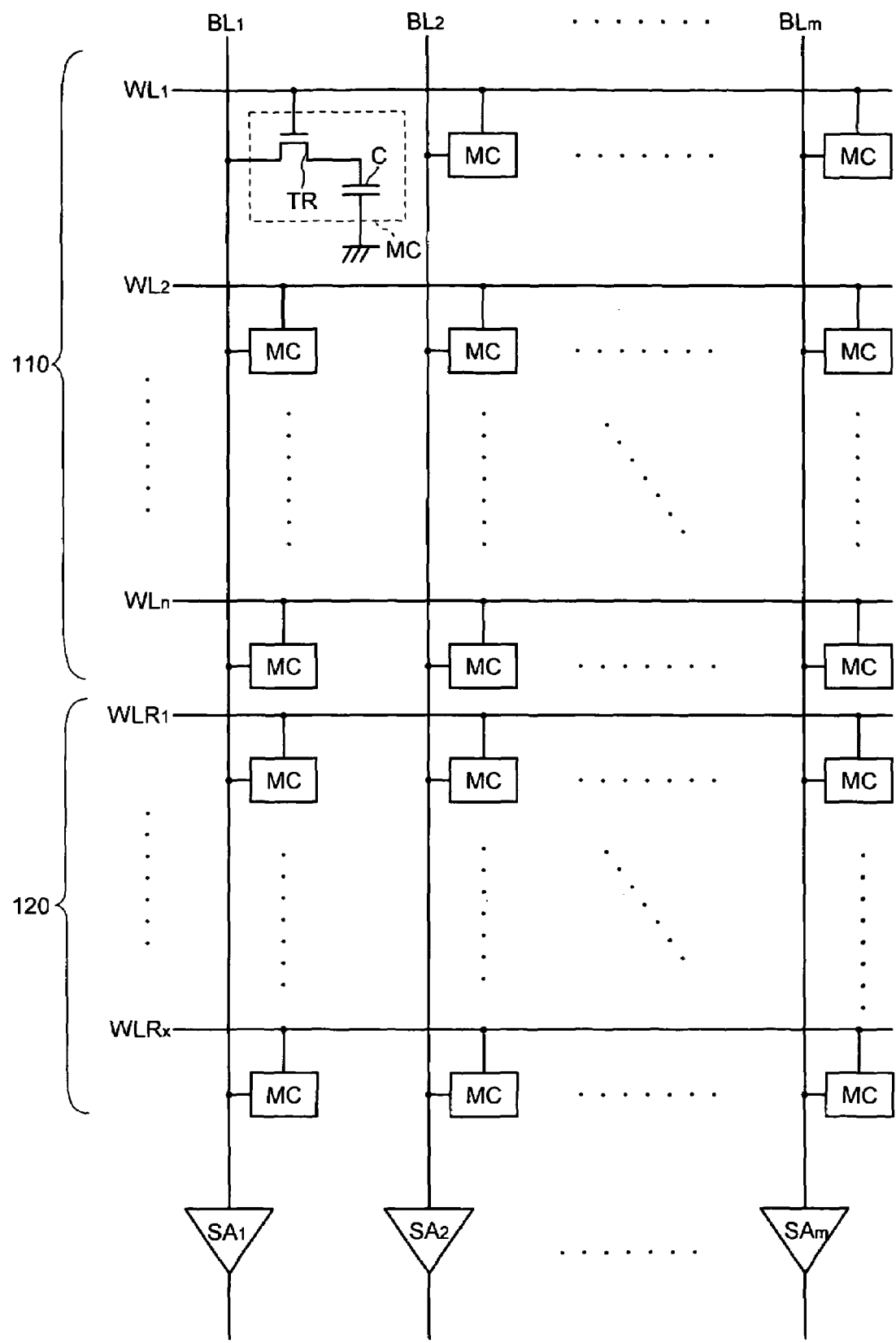
FIG. 2 is a circuit diagram showing configurations of the memory cell array and the redundant memory cell array, respectively when the semiconductor chip shown in FIG. 1 is a DRAM.

FIG. 2 is a circuit diagram showing configurations of the memory cell array 110 and the redundant memory cell array 120, respectively when the semiconductor chip 100 is a DRAM.

As shown in FIG. 2, the memory cell array 110 has a matrix configuration having plural word lines $WL_1$ to $WL_n$ and plural bit lines $BL_1$ to $BL_m$ crossed each other. A memory cell MC is disposed at each intersection. Each memory cell MC is configured by a series circuit of a MOS transistor TR and a capacitor C. A drain of the MOS transistor TR is connected to the corresponding bit lines $BL_1$ to $BL_m$, and a gate electrode of the MOS transistor TR is connected to the corresponding word lines $WL_1$ to $WL_n$.

With this arrangement, when a certain word line $WL_i$ changes to a high level, capacitors C of all memory cells MC connected to the word line $WL_i$ are connected to corresponding bit lines $BL_1$ to $BL_m$. A row decoder (not shown) controls the level of the word lines, based on a row address supplied from the address terminal ADD.

On the other hand, the bit lines $BL_1$ to $BL_m$ are connected to corresponding sense amplifiers $SA_1$ to $SA_m$, respectively. With this arrangement, the sense amplifiers $SA_1$ to $SA_m$ amplify signals read from the memory cells MC, during the read operation, and amplify signals to be written into the memory cells MC, during the write operation. A column decoder (not shown) selects which one of the sense amplifiers $SA_1$ to $SA_m$ should be connected to the data terminal DQ, based on a column address supplied from the address terminal ADD.

In the case where a predetermined memory cell MC is defective in the memory cell array 110 having this configuration, an address corresponding to this memory cell MC becomes a defective address. In the case where a predetermined word line $WL_i$ has a defect, all memory cells that are connected to the word line $WL_i$ become defective. Therefore, all addresses corresponding to these memory cells MC become defective addresses. The redundant memory cell array 120 and the defective address storing circuit group 130 save these defective addresses. These saved defective addresses can be considered as normal addresses.

As shown in FIG. 2, the redundant memory cell array 120 includes plural redundant word lines $WLR_1$ to $WLR_x$ that cross the bit lines $BL_1$ to $BL_m$. A memory cell (a redundant memory cell) MC is disposed at each intersection of the redundant word lines $WLR_1$ to $WLR_x$ and the bit lines $BL_1$ to $BL_m$. The configuration of the redundant word lines $WLR_1$ to $WLR_x$ is exactly the same as the configuration of the normal word lines $WL_1$ to $WL_n$.

In the initial state immediately after a manufacturing, these redundant word lines $WLR_1$ to $WLR_x$ are not selected even when any address is supplied. However, by storing in advance a predetermined address in the defective address storing circuit group 130, when this address is supplied, a predetermined redundant word line $WLR_j$ assigned by the defective address storing circuit group 130 is selected, instead of selecting the original word line $WL_i$ included in the memory cell array 110.

Therefore, by storing a defective address in advance in the defective address storing circuit group 130, when the defective address is supplied, the redundant memory cell array 120 is accessed, instead of the memory cell array 110. Consequently, this address can be handled as a normal address.

While plural redundant bit lines that replace a defective bit line $BL_i$ are provided in the redundant memory cell array 120, these redundant bit lines are not shown in FIG. 2.

Figure 3:
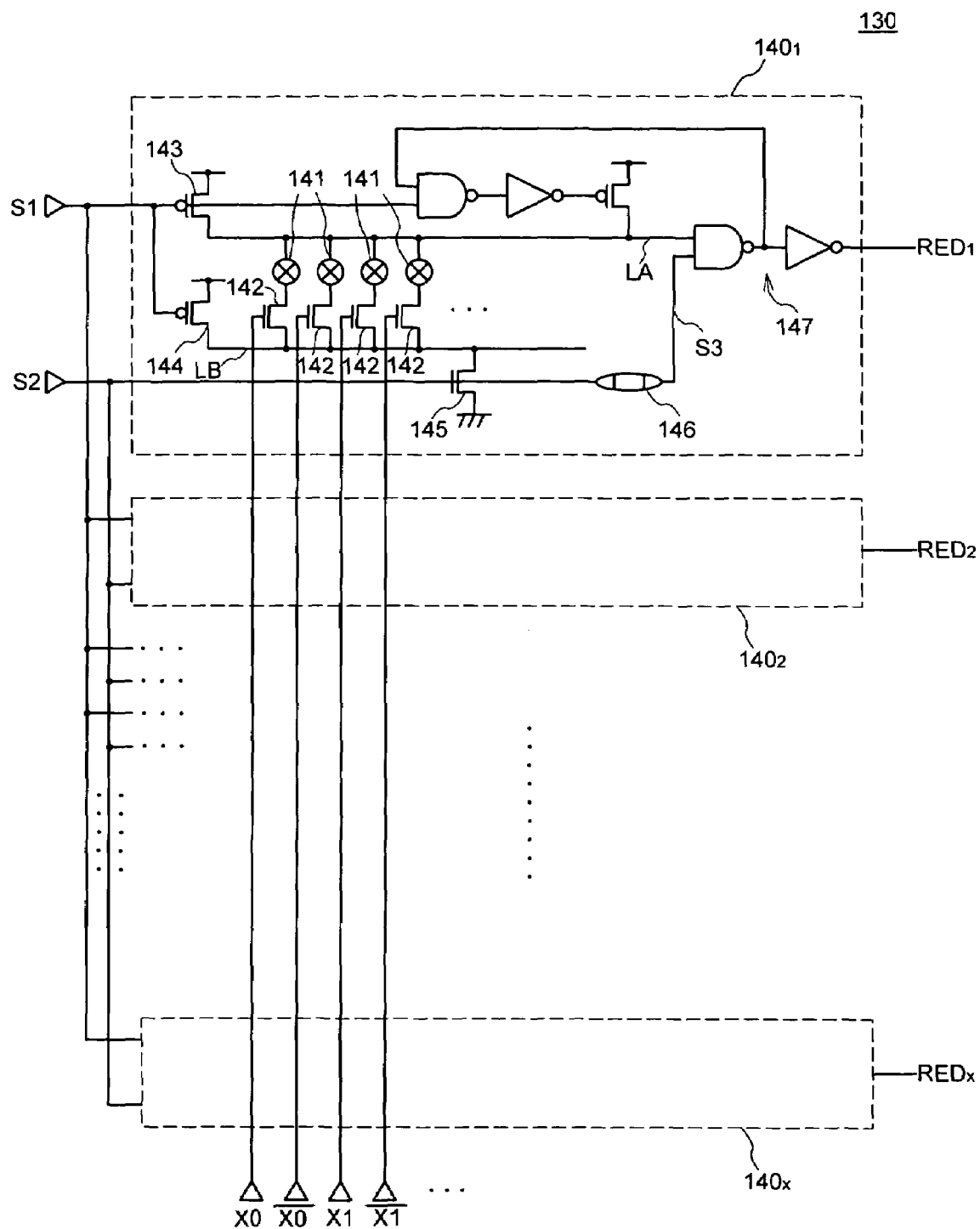
FIG. 3 is a circuit diagram showing one example of a detailed circuit configuration of the defective address storing circuit group shown in FIG. 1.

FIG. 3 is a circuit diagram showing one example of a detailed circuit configuration of the defective address storing circuit group 130. The circuit shown in FIG. 3 is a circuit for controlling a replacement with the redundant word lines $WLR_1$ to $WLR_x$. A circuit for controlling a replacement with the redundant bit lines (not shown) is also present, but is not shown in FIG. 3, because this circuit has substantially the same configuration as that of the circuit for controlling a replacement with the redundant word lines $WLR_1$ to $WLR_x$.

As shown in FIG. 3, the defective address storing circuit group 130 includes a plurality of defective address storing circuits $140_1$ to $140_x$. The defective address storing circuits $140_1$ to $140_x$ correspond to the redundant word lines $WLR_1$ to $WLR_x$, respectively.

The defective address storing circuits $140_1$, to $140_x$ have fuse elements 141, corresponding to row addresses X0, X1, X2, . . . , and inverted signals /X0, /X1, /X2, . . . connected in parallel between a precharge line LA and a discharge line LB. An N-channel MOS transistor 142 is connected in series to each fuse element 141. The gate electrodes of these transistors 142 are supplied with the row addresses X0, X1, X2, . . . , and these inverted signals /X0, /X1, /X2, . . . .

In order to store a defective address in the defective address storing circuit 140, one of the two fuse elements 141 corresponding to each bit of the address is disconnected. For example, when the bit X0 of the address to be stored is "0", the fuse element 141 corresponding to X0 is disconnected, and the fuse element 141 corresponding to /X0 is not disconnected. On the other hand, in the defective memory circuit 140 that does not store a defective address, all fuse elements are set kept in the not-disconnected state.

The precharge line LA and the discharge line LB are connected to a power supply potential (VDD) via P-channel MOS transistors 143 and 144, respectively. With this arrangement, when a timing signal S1 becomes at a low level, thereby the precharge line LA and the discharge line LB are precharged to the power supply potential. The discharge line LB is connected to a ground potential (GND) via an N-channel MOS transistor 145. As a result, when a timing signal S2 becomes at a high level, the discharge line LB is discharged to the ground potential.

Figure 4:
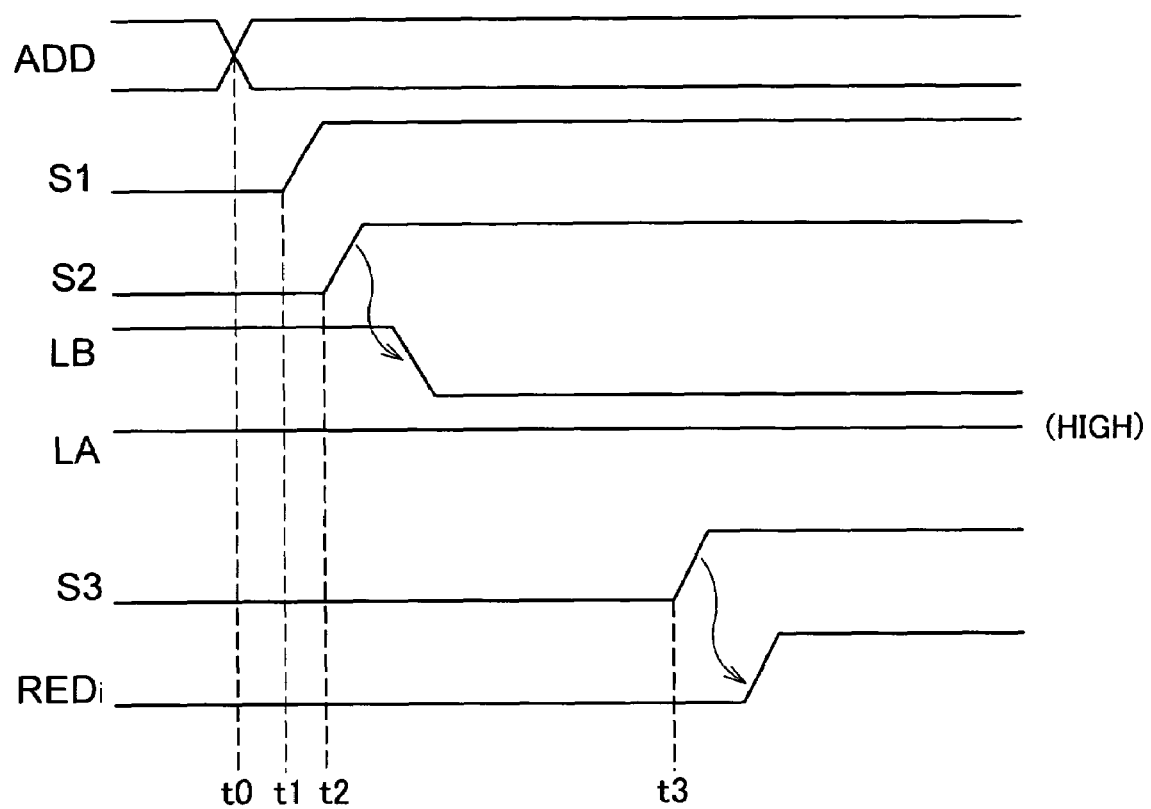
FIG. 4 is a timing chart showing the operation when a predetermined defective address storing circuit shown in FIG. 1 has detected a defective address.

FIG. 4 is a timing chart showing the operation when a predetermined defective address storing circuit $140_j$ has detected a defective address.

In the initial state, the timing signal S1 and S2 at a low level, respectively. Therefore, both the precharge line LA and the discharge line LB are precharged to a high level. A detection signal $RED_j$ is also fixed to a low level.

When the row address ADD changes at time t0, and also when the timing signal S1 changes to a high level at time t1, the precharge operation ends, and both the precharge line LA and the discharge line LB become in a floating state.

When the timing signal S2 changes to a high level at time t2, the transistor 145 is turned on. Therefore, a potential of the discharge line LB changes to a low level. In this case, when the supplied row address ADD coincides with a defective address stored in the defective memory circuit $149_j$, that is, when all transistors 142 corresponding to the disconnected fuse element 141 are turned on also when all transistors 142 corresponding to the non-disconnected fuse element 141 are turned off, the potential of the precharge line LA does not change to a low level and a precharge state is maintained, because there is no electric pass that short-circuits between the precharge line LA and the discharge line LB.

When a timing signal S3 obtained by delaying the timing signal S2 with a delay element 146 changes to a high level at time t3, an input of an AND circuit 147 becomes at a high level. Therefore, a detection signal $RED_j$ as an output signal changes to a high level so as to notify a detection of a defective address. As a result, in place of the word line $WL_i$ that should have been selected, a redundant word line $WLR_j$ corresponding to the defective address storing circuit $140_j$ is activated.

On the other hand, when the supplied row address ADD does not coincide with the defective address stored in the defective address storing circuit $140_j$, that is, when any one of the transistors 142 corresponding to the fuse element 141 not disconnected is turned on, the potential of the precharge line LA changes to a low level in response to a change of the discharge line LB to a low level. As a result, the output detection signal $RED_j$ does not change to a high level.

The operation of other defective address storing circuit is similar to the above. When detection signals $RED_1$ to $RED_x$ become at a high level due to a detection of a defective address, the corresponding redundant word lines $WLR_1$ to $WLR_x$ are activated.

The above explains the outline configuration of the semiconductor chip 100 to which the present invention can be applied.

A magnitude correlation of defective addresses that are stored in plural defective address storing circuits $140_1$ to $140_x$ is explained next.

As described above, the defective address storing circuits $140_1$ to $140_x$ are the circuits that replace word lines corresponding to a defective addresses with the redundant word lines $WLR_1$ to $WLR_x$. Therefore, there is no limit to the layout orders of the defective address storing circuits $140_1$ to $140_x$ and a magnitude correlation of defective addresses that are stored in these defective address storing circuits. For example, when defective addresses a, b, and c are to be stored in three defective address storing circuits $140_1$ to $140_3$ laid out in this order, there are six (the power of three) allocation methods as shown in FIG. 5.

Figure 6A:
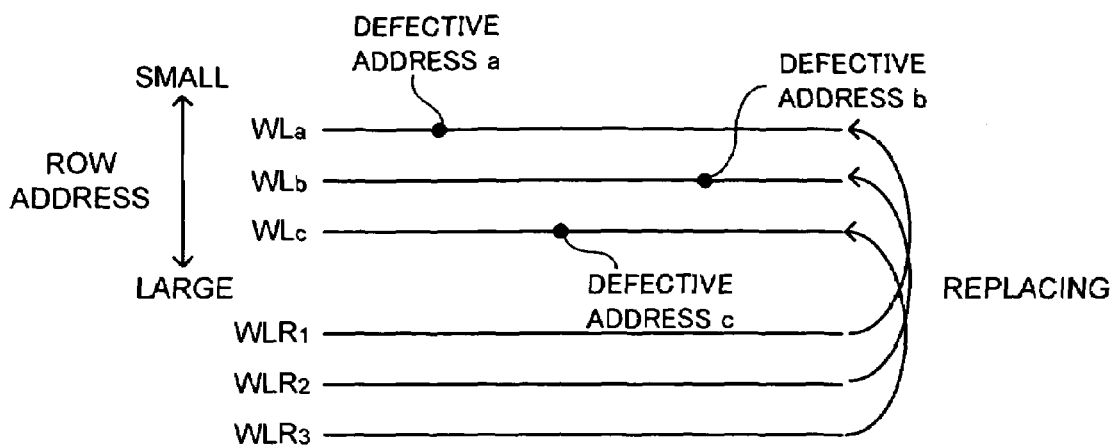
FIG. 6A is a schematic diagram of a state of a replacement following a replacement rule 1 shown in FIG. 5.

Assume that a magnitude correlation of the defective addresses a, b, and c (in this case, a magnitude correlation of row address values) is a<b<c. Following a "replacement rule 1" shown in FIG. 5, the defective addresses are stored as shown in FIG. 6A. Specifically, a word line $WL_a$ corresponding to the defective address a is replaced by the redundant word line $WLR_1$, a word line $WL_b$ corresponding to the defective address b is replaced by the redundant word line $WLR_2$, and a word line $WL_c$ corresponding to the defective address c is replaced by the redundant word line $WLR_3$.

Figure 6B:
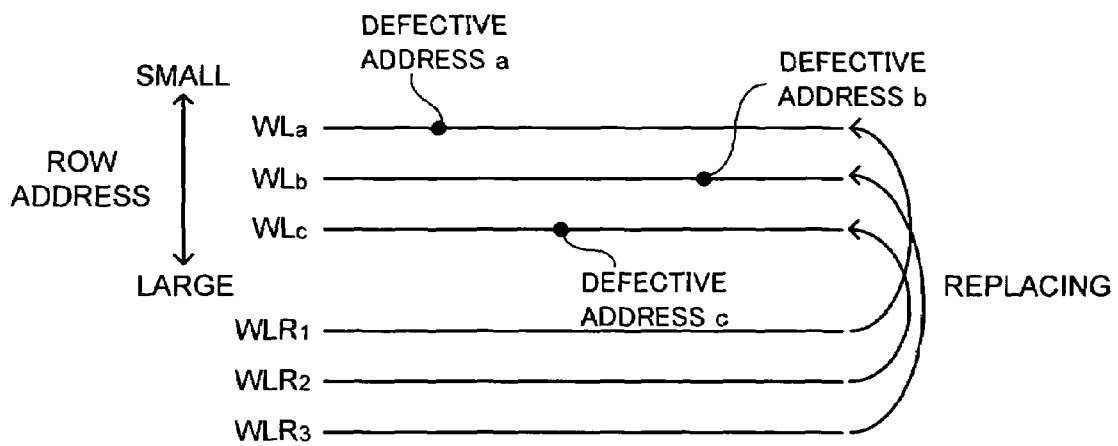
FIG. 6B is a schematic diagram of a state of a replacement following a replacement rule 2 shown in FIG. 5.
Figure 6C:
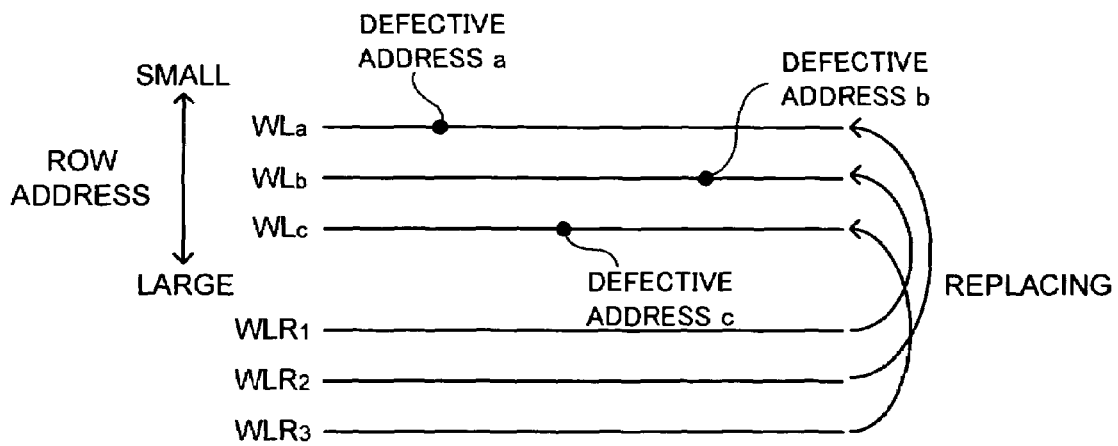
FIG. 6C is a schematic diagram of a state of a replacement following a replacement rule 3 shown in FIG. 5.

Similarly, following a "replacement rule 2" shown in FIG. 5, the defective addresses are stored as shown in FIG. 6B. Following a "replacement rule 3" shown in FIG. 5, the defective addresses are stored as shown in FIG. 6C. While a "replacement rule 4" to a "replacement rule 6" are not shown in the drawings, the effective addresses can be saved normally, following any one of these replacement rules.

A number of replaceable combinations increases when a number of the defective address storing circuits $140_1$ to $140_x$ (that is, a number of the redundant word lines $WLR_1$ to $WLR_x$) increases. Specifically, a huge number of combinations corresponding to the power of X as the number of the redundant address storing circuits $140_1$ to $140_x$ is present.

Focusing attention on this point, according to the present invention, a "replacement rule" for saving defective addresses has information concerning the semiconductor chip. While there is no particular limit to a kind of information, the information can include a lot number, a wafer number within the lot, and a position within the wafer. Therefore, it is possible to know from which wafer of which lot the corresponding semiconductor chip 100 is extracted. Furthermore, a position of the semiconductor chip 100 on the wafer before disconnecting the wafer can be also known.

A method of holding information in the defective address storing circuits is not particularly limited. For example, when five defective address storing circuits $140_1$ to $140_x$ are handled as one group, each group can have one information, and information corresponding to the number of groups can be stored. In other words, when five defective address storing circuits $140_1$ to $140_x$ are handled as one group, five defective address storing circuits (for example, the defective address storing circuits $140_1$ to $140_5$) can store one of 120 kinds (that is, the power of five) of information. 120 kinds of information can be prepared by allocating numerals 0 to 9, capital alphabets, and small alphabets to replacement rules, as shown in FIG. 7, for example. Therefore, the semiconductor chip 100 can have complex information, based on combinations of characters that are stored in each group.

The above explains the principle of the present invention. Preferred embodiments of the present invention are explained in detail below.

Figure 8:
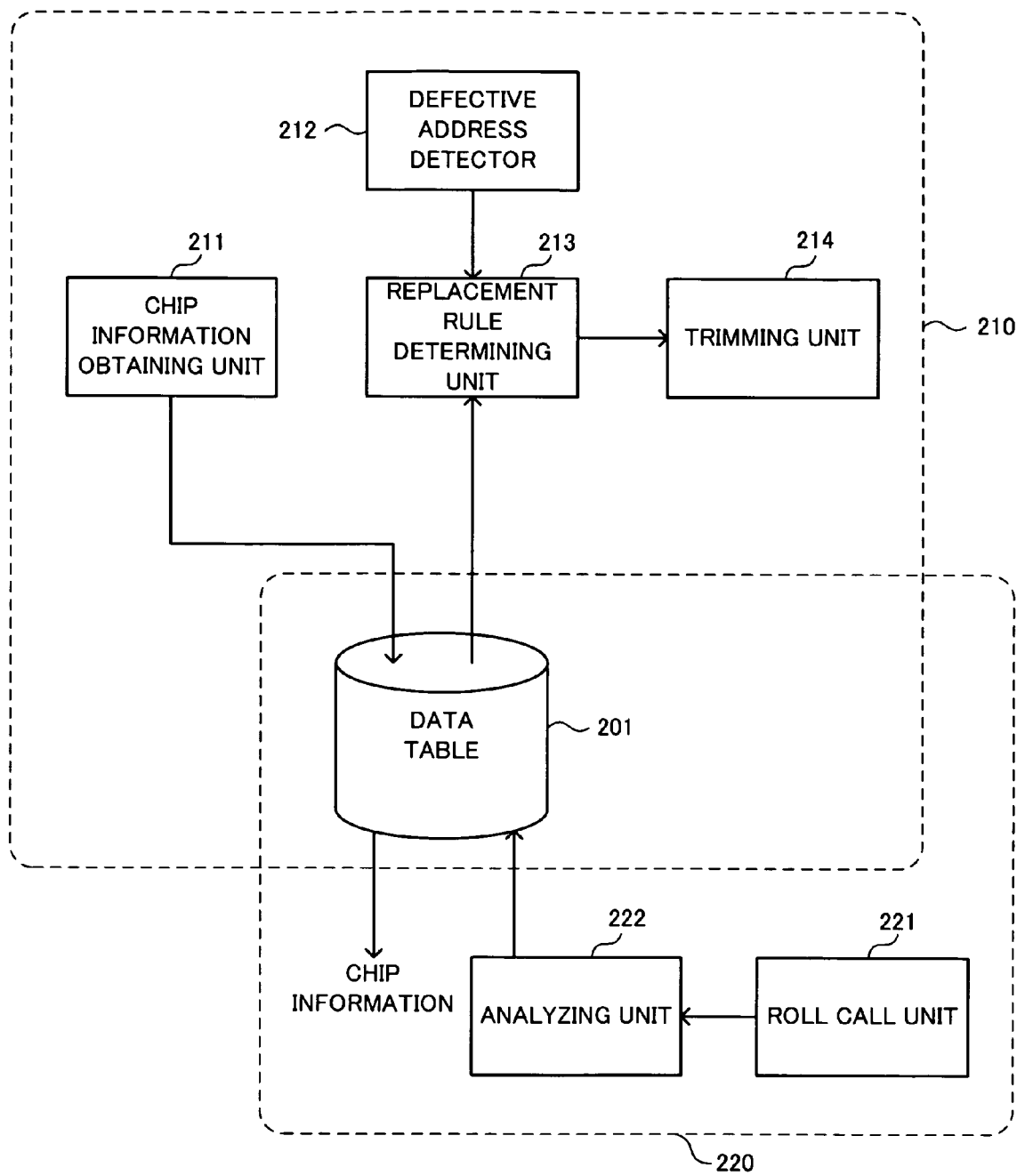
FIG. 8 is a block diagram showing a configuration of a chip information management system according to a preferred embodiment of the present invention.

FIG. 8 is a block diagram showing a configuration of a chip information management system 200 according to a preferred embodiment of the present invention.

As shown in FIG. 8, the chip information management system 200 includes a chip information recording system 210 and a chip information obtaining system 220. A data table 201 is used in common for the chip information recording system 210 and the chip information obtaining system 220. The data table 201 shows a relationship between a replacement rule and an allocated character in the redundant memory cell array 120, as shown in FIG. 7. Therefore, the data table 201 is essentially different from the database described in Japanese Patent Publication No. 3,555,859, that is, the database that stores information specific to each semiconductor chip. A data quantity does not depend on a number of produced chips. Therefore, a remarkably small quantity of data is sufficient.

The chip information recording system 210 records desired information in the semiconductor chip 100 when the semiconductor chip 100 is manufactured. The chip information recording system 210 includes a chip information obtaining unit 211, a defective address detector 212, a replacement rule determining unit 213, and a trimming unit 214, in addition to the data table 201.

The chip information obtaining unit 211 obtains information concerning each semiconductor chip 100, such as a lot number, a wafer number within the lot, and a position of the chip within the wafer. A computer that manages a production line can achieve this function.

The defective address detector 212 detects a defective address included in each semiconductor chip 100. A semiconductor tester that performs an operation test in the wafer state and a computer that controls the operation test can achieve this function.

The replacement rule determining unit 213 determines defective address storing circuits into which plural defective addresses detected by the defective address detector 212 are to be stored. The replacement rule determining unit 213 specifies a replacement rule corresponding to information (such as a combination of characters) obtained from the chip information obtaining unit 211 by referring to the data table 201, and determines defective addresses that are to be stored and defective address storing circuits that store the defective addresses, following the specified replacement rule. A computer that manages a production line can achieve this function.

The trimming unit 214 trims the fuse elements 141 included in the defective address storing circuits $140_1$ to $140_x$, based on a determination made by the replacement rule determining unit 213. A general trimming unit that trims a fuse by irradiating a laser beam and a computer that controls this operation can be used to achieve this function.

On the other hand, the chip information obtaining system 220 reads information stored in the semiconductor chip 100, during or after manufacturing the chip, and includes a roll call unit 221 and an analyzing unit 222, in addition to the data table 201.

The roll call unit 221 reads defective addresses that are stored in the defective address storing circuits $140_1$ to $140_x$, based on a roll call test. A general tester that can perform a roll call test and a computer that controls this operation can be used to achieve this function.

The analyzing unit 222 analyzes information stored in the semiconductor chip 100, by referring to the data table 201, based on a relationship between the defective addresses obtained by the roll call unit 221 and the defective address storing circuits $140_1$ to $140_x$ that store the defective addresses. A computer that can be connected to the data table 201 can be used to achieve this function.

As described above, the chip information management system 200 according to the present embodiment includes the chip information recording system 210 and the chip information obtaining system 220. The chip information recording system 210 and the chip information obtaining system 220 share the data table 201. Therefore, the chip information management system 200 can be configured by physically different hardware.

A chip information management method according a preferred embodiment of the present invention is explained next. The chip information management method according to the present embodiment can be executed using the chip information management system 200 shown in FIG. 8 as hardware and using a "chip information management program" as software. The chip information management method according to the present embodiment is divided into a chip information recording method and a chip information obtaining method, and these divided methods are explained in order.

The chip information recording method is executed using the chip information recording system 210 shown in FIG. 8 as hardware and using a "chip information recording program" that forms a part of the chip information management program as software. The chip information recording program can be executed using a computer that forms a part of the chip information recording system 210, that is, as shown in FIG. 9, a computer 300 having a normal configuration, having a CPU 301, a ROM 302, a RAM 303, and an I/O circuit 304 connected to each other via a bus 305.

Figure 9:
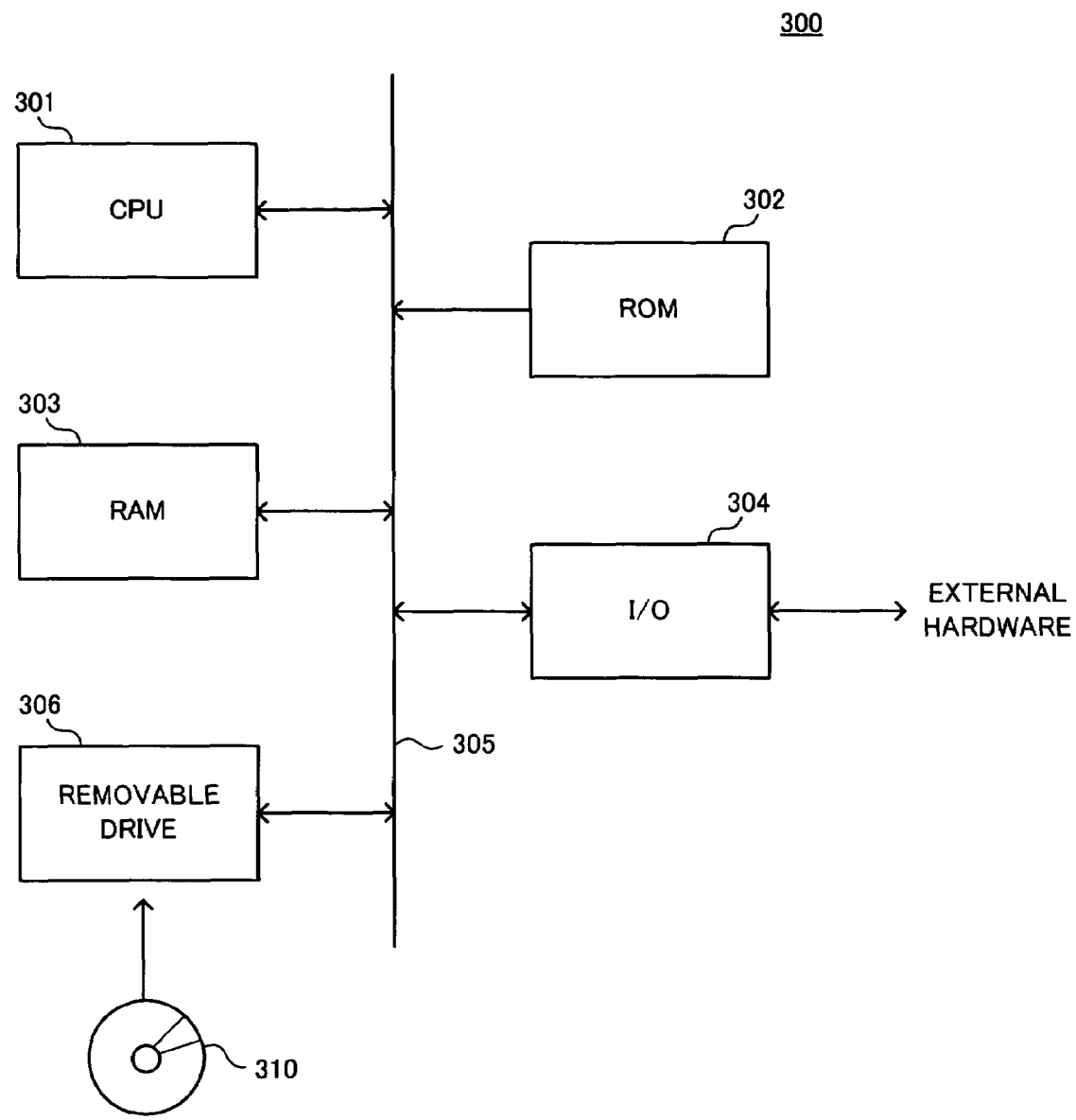
FIG. 9 is a block diagram showing a configuration of a computer that forms a part of a chip information recording system or a chip information obtaining system.

The chip information recording program is stored in the ROM 302 or the RAM 303 of the computer shown in FIG. 9. The CPU 301 executes the chip information recording program, thereby controlling the external hardware connected to the I/O circuit 304. Alternatively, the chip information recording program is stored in a recording medium 310 such as a CD-ROM, and a removable drive 306 connected to the bus 305 is used to read this program, thereby controlling the hardware connected to the I/O circuit 304.

Figure 10:
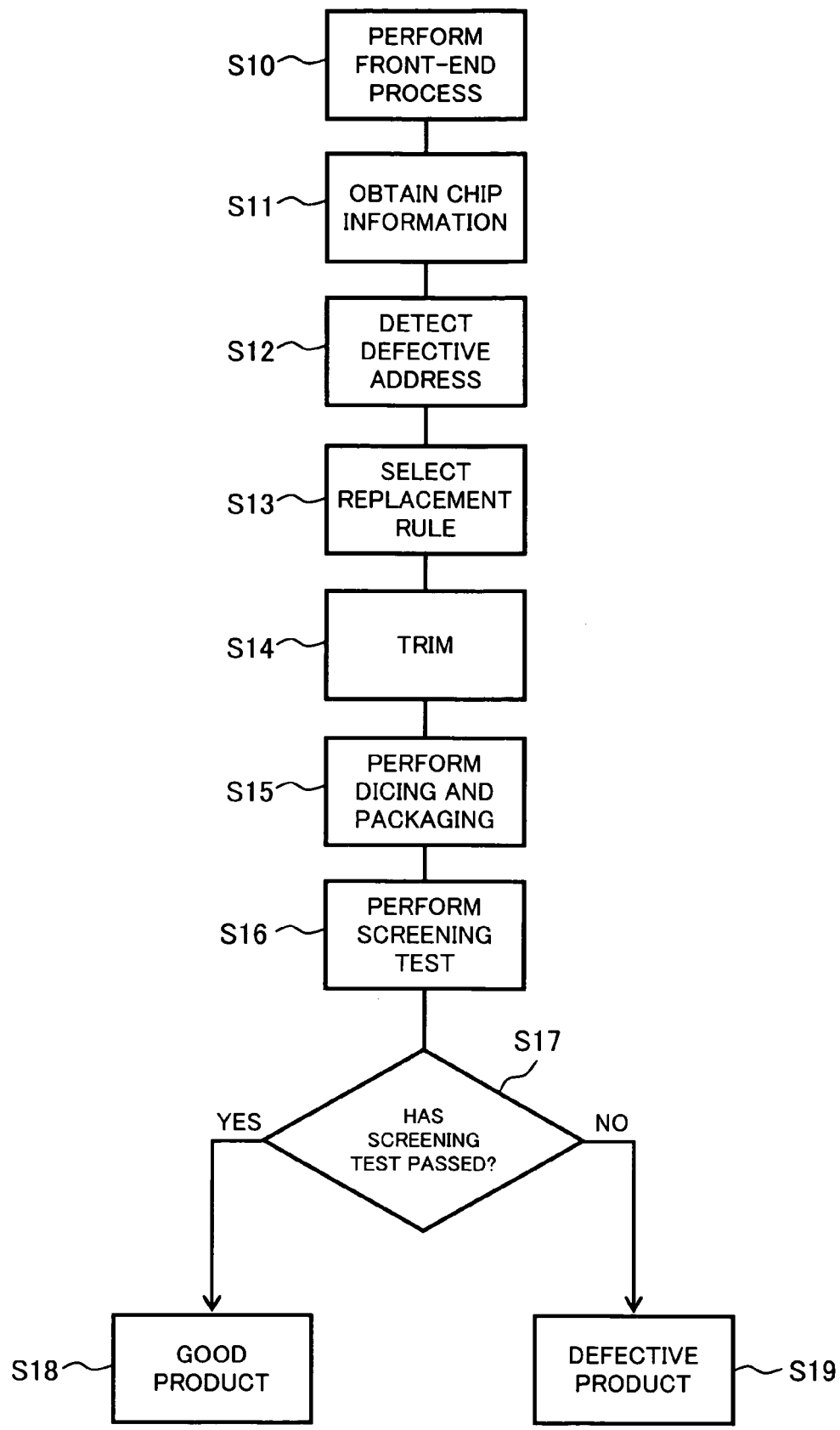
FIG. 10 is a flowchart for explaining the chip information recording method.

FIG. 10 is a flowchart for explaining the chip information recording method.

As shown in FIG. 10, after a front-end process to a semiconductor wafer is completed, each semiconductor chip 100 on the wafer becomes in an operable state (step S10). The chip information obtaining unit 211 shown in FIG. 8 is then used to obtain information concerning the semiconductor chip 100 (step S11). The defective address detector 212 is used to detect a defective address in the wafer state (step S12). The information concerning the semiconductor chip 100 includes a lot number, a wafer number within the lot, and a position of the chip within the wafer, as explained above. The information concerning the semiconductor chip 100 can include other pieces of information, such as a date of manufacturing, a name of a factory, and a serial number, together with or instead of these pieces of information.

In step S12, it is detected not only an address that cannot be written or read is detected, but also an address has a poor data holding characteristic.

In other words, as explained above with reference to FIG. 2, the memory cell MC of a DRAM includes one capacitor C and one MOS transistor TR, and stores information depending on a charge stored in the capacitor C. Information stored in the memory cell MC is lost due to a leak current, unless refresh operation is performed periodically. Therefore, the memory cell MC needs to be refreshed before the information is lost due to the leak current.

A refresh cycle ($=t_{REF}$) of the memory cell MC is determined as 64 msec by standard, for example. This means that information of each memory cell is required to be kept for at least $t_{REF}$. Therefore, a memory cell of which information holding time is less than $t_{REF}$ is a "refresh defective cell" having a poor data holding characteristic. An address corresponding to the refresh defective cell is also handled as a "defective address".

After a detection of defective addresses has been completed, any one of the defective address storing circuits $140_1$ to $140_x$ in which the defective address detected by the defective address detector 212 is to be stored is selected (step S13).

In general, defective addresses are sequentially stored in the defective address storing circuits $140_1$ to $140_x$ in a small order of defective address values. However, as described above, according to the present invention, because a layout order of the defective address storing circuits $140_1$ to $140_x$ and magnitude correlation of the defective addresses to be stored have information, a replacement rule is selected based on the held information.

This selection is performed by specifying a replacement rule, based on the information obtained at step S11, by referring to the data table 201, and by determining a defective address storing circuit that stores the defective address detected at step S12, following the specified replacement rule. A replacement rule determining unit 213 shown in FIG. 8 performs this operation.

Figure 11:
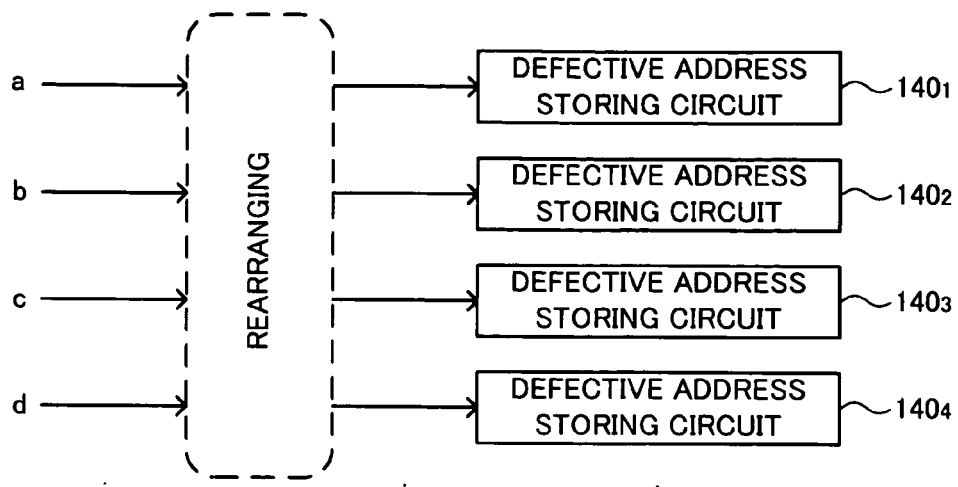
FIG. 11 is a conceptual diagram of one example of select operation at step S13.

The replacement rule determining unit 213 can perform the above operation as follows. After the detected defective addresses a, b, c, d, . . . (a<b<c<d< . . . ) are arranged in the address order, these defective addresses are rearranged following the information to be held in the semiconductor chip 100. The rearranged defective addresses a, b, c, d, . . . are allocated to the defective address storing circuits $140_1$ to $140_x$ in the layout order, as shown in FIG. 11.

Figure 12:
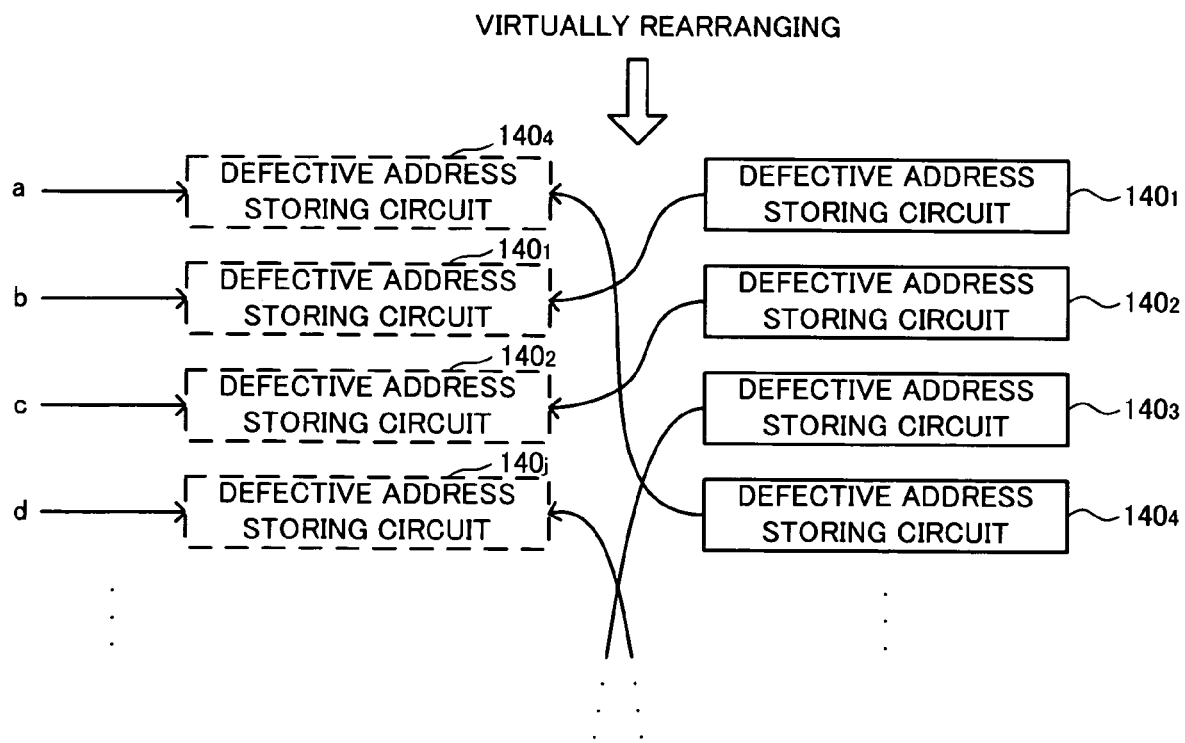
FIG. 12 is a conceptual diagram of another example of select operation at step S13.

Alternatively, as shown in FIG. 12, the layout order of the defective address storing circuits $140_1$ to $140_x$ is virtually rearranged, following the information to be held in the semiconductor chip 100. The defective addresses can be allocated to the virtually rearranged defective address storing circuits $140_1$ to $140_x$ in the order of the addresses.

After the allocation of the defective addresses is determined in this way, the defective addresses allocated to the defective address storing circuits $140_1$ to $140_x$ are actually stored (step S14). The trimming unit 214 is used to perform this operation, by irradiating a laser beam to a predetermined fuse element 141 included in the defective address storing circuits $140_1$ to $140_x$, thereby cutting the predetermined fuse. As a result, in the semiconductor chip 100, the memory cells corresponding to the defective addresses are replaced by the memory cells within the redundant memory cell array, thereby saving the detected defective addresses.

Thereafter, a dicing unit is used to dice the semiconductor wafer into individual semiconductor chips 100. The individual semiconductor chips 100 obtained are accommodated in a predetermined package (step S15), thereby providing completed chips.

Various kinds of screening tests such as a burn in test are performed to the completed semiconductor chip 100 (step S16). When the semiconductor chip 100 has passed a screening test (step S17: YES), this semiconductor chip 100 is shipped as a good product (step S18). When the semiconductor chip 100 does not pass a screening test (step S17: NO), this semiconductor chip 100 is handled as a defective product (step S19).

The defective semiconductor chip can be abandoned directly. However, when it is necessary to obtain position information of the chip on the wafer to specify a cause of the defect, the following chip obtaining method explained next is executed.

The chip information obtaining system 220 shown in FIG. 8 as hardware executes the chip information obtaining method, using the "chip information obtaining program" that forms a part of the chip information management program as software. A computer that forms a part of the chip information obtaining system 220 executes the chip information obtaining program.

A hardware configuration of the computer that forms a part of the chip information obtaining system 220 is a computer having a normal configuration such as the computer 300 shown in FIG. 9. The chip information obtaining program can be stored in the recording medium 310 such as a CD-ROM. The removable drive 306 that is connected to the bus 305 can be used to read and execute this chip information obtaining program.

Figure 13:
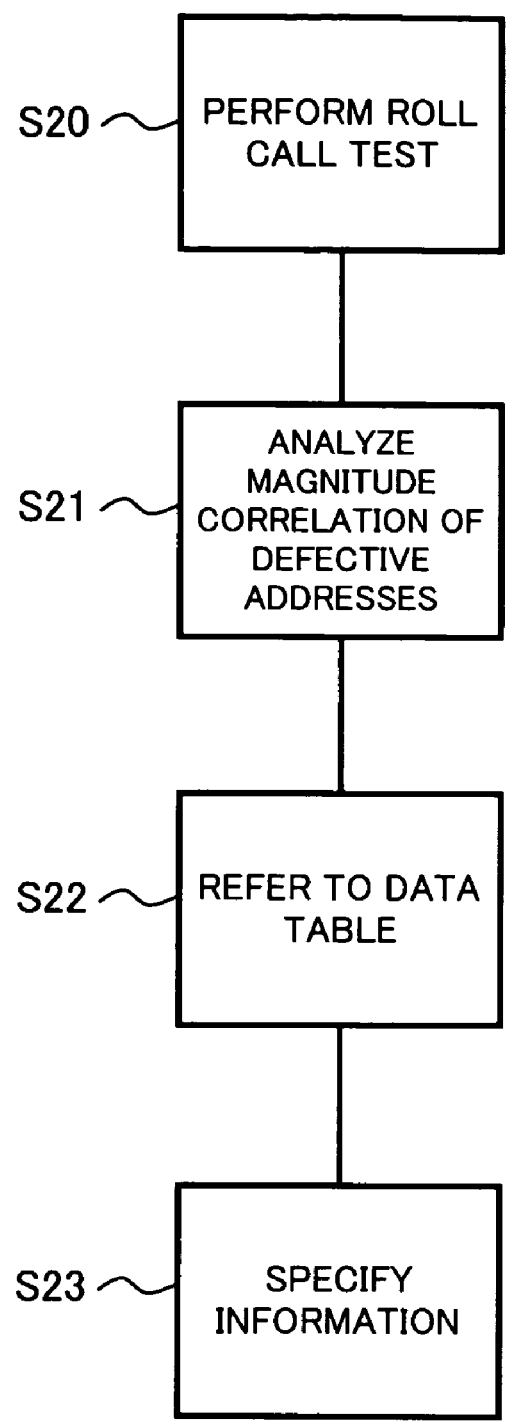
FIG. 13 is a flowchart for explaining the chip information obtaining method.

FIG. 13 is a flowchart for explaining the chip information obtaining method.

As shown in FIG. 13, according to the chip information obtaining method, a roll call test is performed in order to detect defective addresses stored in the defective address storing circuits $140_1$ to $140_x$ (step S20). The roll call unit 221 shown in FIG. 8 performs this roll call test. In the roll call test at step S20, a relationship between the defective memory circuits $140_1$ to $140_x$ and the defective addresses is read, by relating defective addresses to defective address storing circuits that store the defective addresses. The analyzing unit 222 analyzes a layout order of the defective memory circuits $140_1$ to $140_x$ and a magnitude correlation of the defective addresses stored in these defective address storing circuits, based on the read information (step S21).

Further, the analyzing unit 222 refers to the data table 201 (step S22), and obtains information (characters) allocated to the analyzed magnitude correlation, thereby specifying various information stored in the semiconductor chip 100 (step S23). Therefore, when the information stored in the semiconductor chip 100 includes a lot number, a wafer number within the lot, and a position of the chip within the wafer, these pieces of information can be obtained even after the wafer is divided into semiconductor chips. Consequently, a cause of a defective chip can be found.

The above chip information obtaining process can be applied to not only the semiconductor chip 100 that is handled as a defective chip, but also the semiconductor chip 100 that is handled as a good product. In other words, when it is necessary to obtain information of the semiconductor chip 100 that operates normally, such as a lot number of the chip for various purposes, the chip information can be analyzed following the flowchart shown in FIG. 13, thereby obtaining various kinds of stored information.

As explained above, according to the present embodiment, a special circuit that stores various kinds of chip information does not need to be added to the semiconductor chip 100. Therefore, a chip size does not increase at all. A database that stores information specific to each semiconductor chip 100 is not used, but the data table 201 that shows a relationship between a replacement rule and information such as a character to be allocated to each chip is used. Therefore, the amount of data in the data table 201 can be made very small. Even when there are plural semiconductor chips of which distributions of defective addresses are exactly the same, these semiconductor chips can have mutually different information.

A process to be performed when the number of defective addresses to be saved is not sufficiently large is explained next.

The chip information management system and the chip information management method explained above are based on presence of many defective addresses. This is because, in the information storing system according to the present invention, substantially a large amount of information cannot be stored, unless a certain number of defective addresses are present. Therefore, when the number of defective addresses is small, desired information cannot be stored in some cases.

In order to solve this problem, a memory cell having lower performance than other memory, though not defective in standard, is replace by the redundant memory cell array 120, thereby increasing the number of defective addresses while improving the performance of the semiconductor chip 100. A defective address generated by this arrangement meets the standard, and therefore, should be distinguished from an originally defective address that does not meet the standard. To avoid complexity of explanation, in the present invention, this defective address that meets the standard is also called a "defective address".

This is explained specifically below. When the semiconductor chip 100 is a DRAM, while the information holding time $t_{REF}$ to be satisfied is determined as 64 msec by the standard in advance as described above, most of memory cells substantially exceed the information holding time $t_{REF}$ determined by the standard. Therefore, when the information holding time $t_{REF}$ of all memory cells used exceed the standard value, these memory cells can be shipped as low refreshed cycle products. For example, when the information holding time $t_{REF}$ of all memory cells used is equal to or above 128 msec, the refresh cycle required by the semiconductor chips 100 is doubled to 128 msec, and a high added value is given to the chips as lower power consumption chips.

To which level the refresh cycle can be extended can be determined by gradually setting a longer refresh cycle in the operation test. In other words, a cycle immediately before the number of errors that increase by setting a gradually longer refresh cycle exceeds a number of chips by the redundant memory cell array 120 can be determined as a maximum refresh cycle of the semiconductor chip 100. When the refresh cycle is extended, redundant word lines and redundant bit lines included in the redundant memory cell array 120 are used in a necessarily high proportion. Therefore, defective addresses that are necessary to store chip information can be secured by a sufficient number. When the refresh cycle is extended, the added value of the chips also improves.

Figure 14:
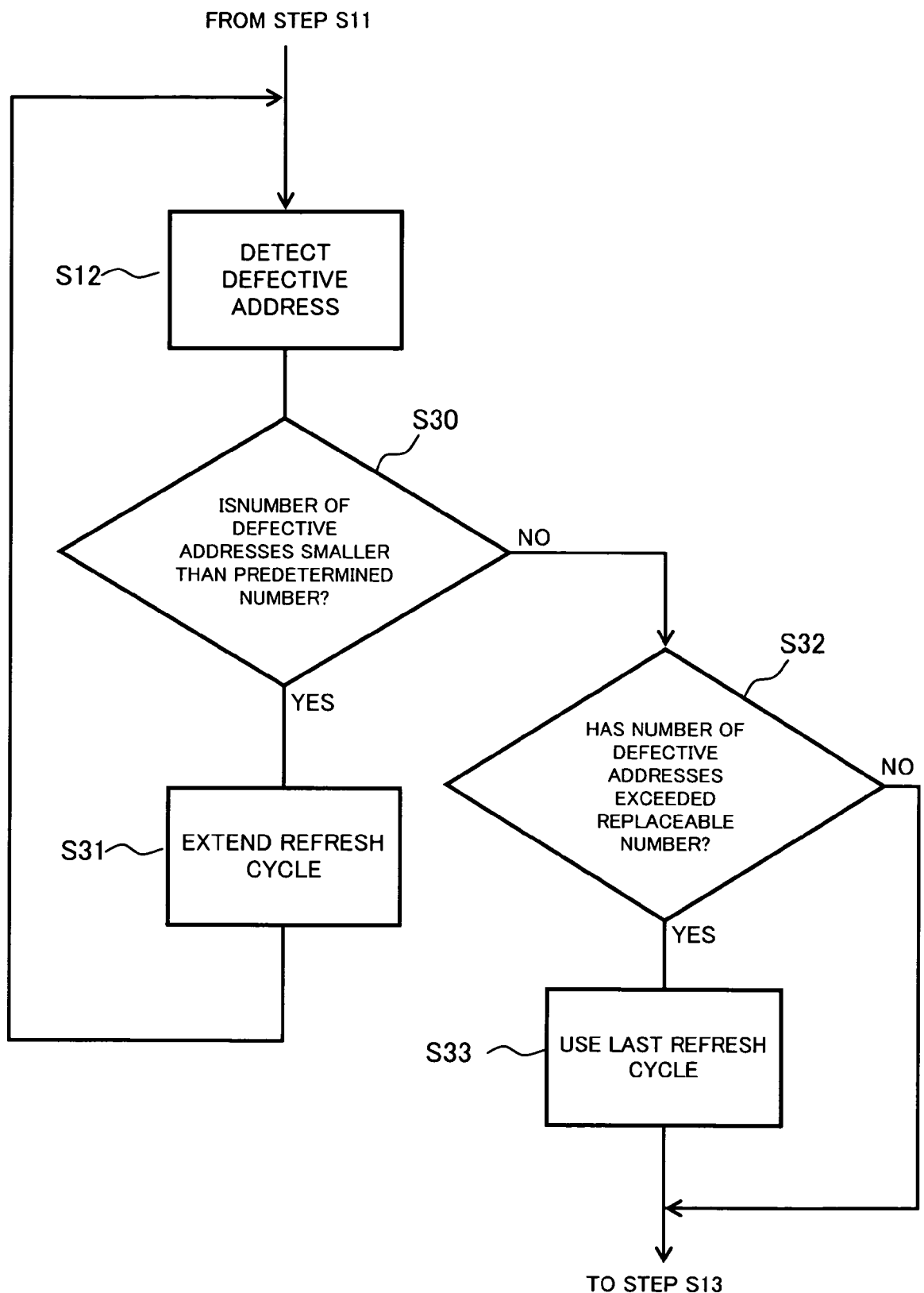
FIG. 14 is a flowchart showing one example of a method of increasing defective addresses by extending a refresh cycle.

FIG. 14 is a flowchart showing one example of a method of increasing defective addresses by extending a refresh cycle. The defective address detector 212 can perform the process shown in FIG. 14.

First, the defective address detector 212 detects defective addresses (step S12), and counts the number of the generated defective addresses. When the number of the defective addresses is smaller than a predetermined number (step S30: YES), the defective address detector 212 determines that a necessary number of defective addresses to store chip information are not secured, and extends the refresh cycle (step S31). The defective address detector 212 detects defective addresses again (step S12).

When the number of defective addresses becomes equal to or larger than the predetermined number as a result of repeating this process (step S30: NO), the defective address detector 212 determines whether the number of the generated defective addresses exceeds the number of defective addresses that can be replaced by the redundant memory cell array 120 (step S32). When the number of the generated defective addresses does not exceed the number of defective addresses that can be replaced by the redundant memory cell array 120 (step S32: NO), the process proceeds to step S13 shown in FIG. 10, and a replacement rule is selected. On the other hand, when the number of the generated defective addresses exceeds the number of defective addresses that can be replaced by the redundant memory cell array 120 (step S32: YES), a defective address in the refresh cycle set last is used.

According to this method, by extending the refresh cycle, a necessary number of defective addresses to store chip information can be secured while improving the added value of the chips.

A storing system that takes into account presence of defects in the redundant word lines and the redundant bit lines included in the redundant memory cell array 120 is explained next.

Redundant word lines and redundant bit lines included in the redundant memory cell array 120 also unavoidably include some defects, just like the memory cell array 110 includes many defects. Therefore, like in the present invention, in the absence of a certain level of redundancy in holding information in the method of replacing defective addresses, there are some cases that information cannot be stored correctly.

Figure 15:
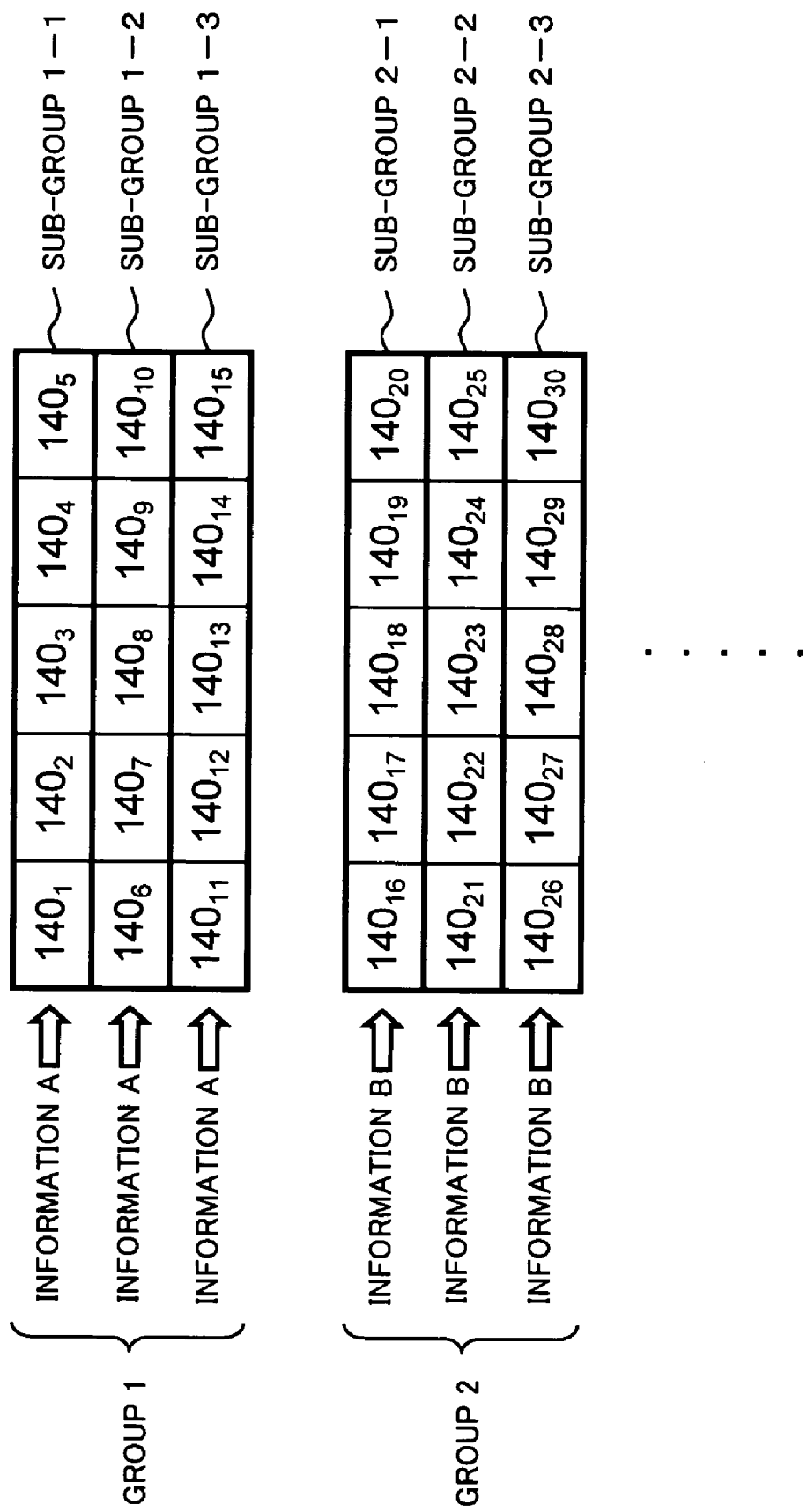
FIG. 15 is an explanatory diagram of a method of providing a redundancy by storing the same defective addresses in plural sub-groups.

In order to solve this problem, the same information can be repeatedly stored in a predetermined area of the defective address storing circuits $140_1$ to $140_x$. For example, as shown in FIG. 15, the defective address storing circuits $140_1$ to $140_x$ can be divided into 15 groups, and the defective address storing circuits included in each group can be divided into three sub-groups, each sub-group including five circuits. In the example shown in FIG. 15, sub-groups 1-1, 1-2, and 1-3 that constitute the defective address storing circuits $140_1$ to $140_{15}$ has the same information A, and sub-groups 2-1, 2-2, and 2-3 that constitute the defective address storing circuits $140_{16}$ to $140_{30}$ has the same information B.

According to this method, even when a predetermined defective address storing circuit $140_j$ cannot be used due to a defect in a redundant word line or a redundant bit line corresponding to this circuit, and as a result, when the defective address cannot be replaced following the information to be saved, information can be read correctly when a desired replacement is performed in the rest of sub-groups.

Figure 16:
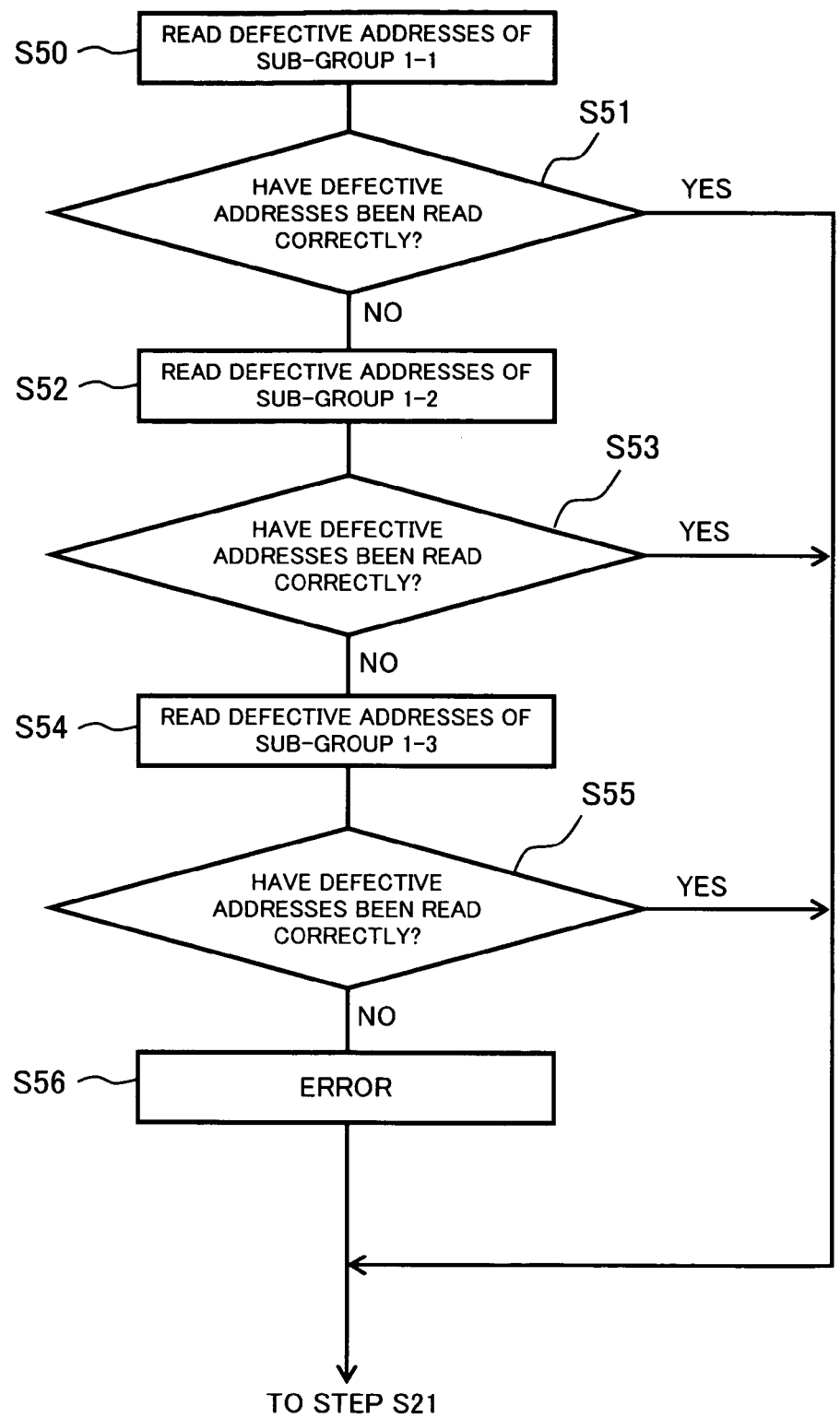
FIG. 16 is a flowchart for explaining the method of obtaining chip information when information is held in the method shown in FIG. 15.

FIG. 16 is a flowchart for explaining the method of obtaining chip information when information is held in the method shown in FIG. 15.

First, as shown in FIG. 16, a call roll test is performed to read defective addresses stored in the defective address storing circuits $140_1$ to $140_5$ that constitute the sub-group 1-1 (step S50). Next, it is determined whether the five defective addresses have been read out correctly (step S51). When the five defective addresses have been read out correctly (step S51: YES), a layout order of the defective address storing circuits $140_1$ to $140_5$ and a magnitude correlation of the defective addresses stored in these circuits are analyzed (step S21). As a result, the analysis of the group 1 ends. The group 2, the group 3, . . . , are analyzed similarly.

On the other hand, when the five defective addresses are not read out correctly (step S51: NO), defective addresses stored in the defective address storing circuits $140_6$ to $140_{10}$ that constitute the next sub-group 1-2 are read out (step S52). Next, it is determined whether the five defective addresses have been read out correctly (step S53). That the five defective addresses are not read out correctly means that at least one of the defective address storing circuits $140_1$ to $140_5$ that constitute the sub-group 1-1 has a defect, and as a result, the number of defective addresses that have been read out is four or below. When the five defective addresses have been read out correctly from the sub-group 1-2 (step S53: YES), a layout order of the defective address storing circuits $140_6$ to $140_{10}$ and a magnitude correlation of the defective addresses stored in these circuits are analyzed (step S21). As a result, the analysis of the group 1 ends.

When the five defective addresses are not readout correctly from the sub-group 1-2 (step S53: NO), defective addresses stored in the defective address storing circuits $140_{11}$ to $140_{15}$ that constitute the next sub-group 1-3 are read out (step S54). Next, it is determined whether the five defective addresses have been read out correctly (step S55). When the five defective addresses have been read out correctly from the sub-group 1-3 (step S55: YES), a layout order of the defective address storing circuits $140_{11}$ to $140_{15}$ and a magnitude correlation of the defective addresses stored in these circuits are analyzed (step S21). As a result, the analysis of the group 1 ends.

However, when five defective addresses are not read out correctly from any one of the sub-group 1-1 to the sub-group 1-3 (step S55: NO), an error process is performed because the information cannot be read out (step S56). As a result, the analysis of the group 1 ends.

Figure 17:
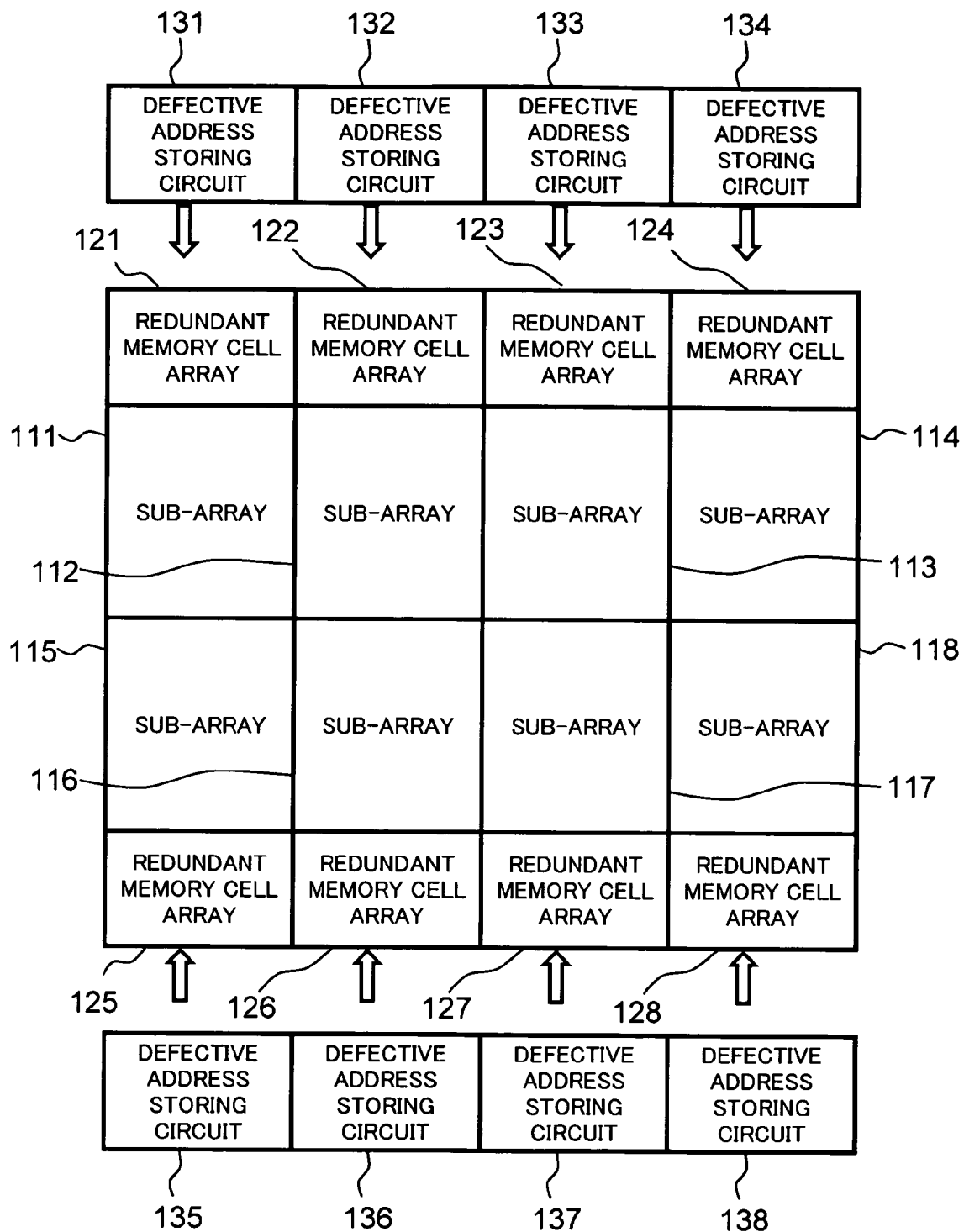
FIG. 17 is a schematic diagram of a configuration of semiconductor chips having a memory cell array divided into plural sub-arrays.

When the memory cell array 110 is divided into plural sub-arrays 111 to 118, and when the redundant memory cell array 120 and the defective address storing circuit group 130 are divided into plural redundant memory cell arrays 121 to 128 and defective address storing circuits 131 to 138 respectively corresponding to the divided memory cell array as shown in FIG. 17, each sub-group (for example, the sub-group 1-1 to the sub-group 1-3) that constitutes the same group (for example, the group 1) can be selected from the defective address storing circuits 131 to 138 or from the different defective address storing circuits 131 to 138.

The present invention is in no way limited to the aforementioned embodiments, but rather various modifications are possible within the scope of the invention as recited in the claims, and naturally these modifications are included within the scope of the invention.

In the above embodiment, the defective address storing circuits $140_1$ to $140_x$ include plural fuse elements 141, and defective addresses are stored by disconnecting the fuse elements 141. However, the use of fuses is not essential, and defective addresses can be stored in other memory element such as an EPROM.

In the defective address storing circuits $140_1$ to $140_x$ according to the present embodiment, a pair (two) of fuse elements 141 are allocated to each bit, and one of the two fuse elements 141 is disconnected to store a defective address.

Figure 18:
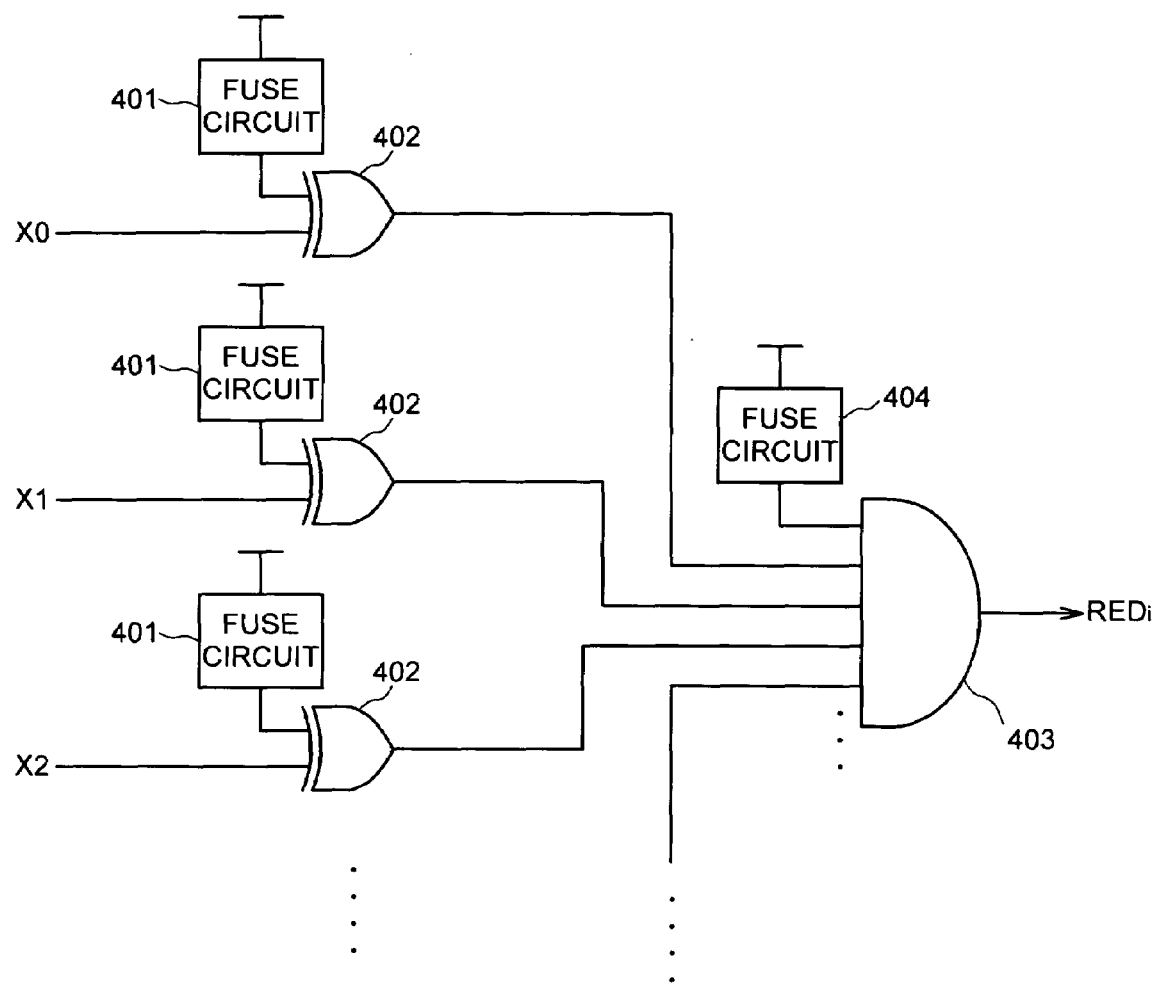
FIG. 18 is another circuit configuration diagram of a defective address storing circuit.
Figure 19:
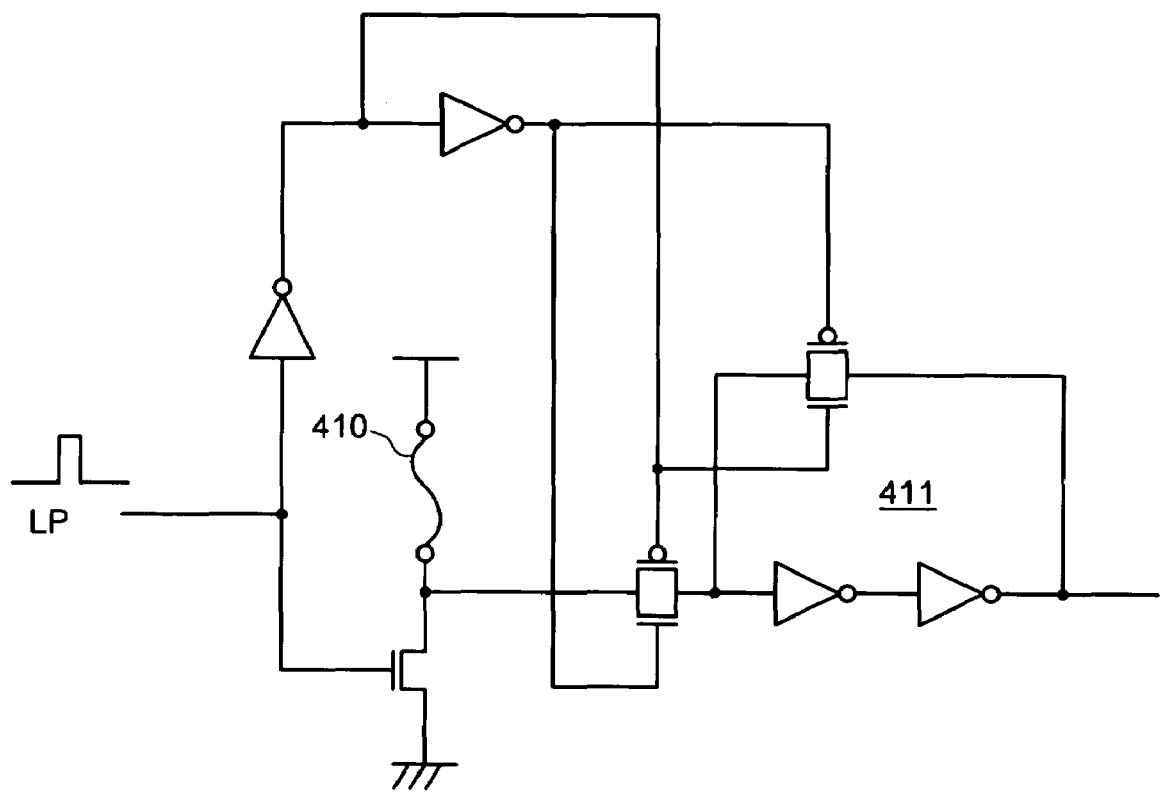
FIG. 19 is a circuit diagram of fuse circuit shown in FIG. 18.

However, the configuration of the defective address storing circuit is not limited to this, and other type of defective address storing circuit as shown in FIG. 18 can be also used. In other words, one fuse circuit 401 is allocated to each bit. An EXOR circuit 402 generates an exclusive OR signal of an output of the fuse circuit 401 and a corresponding bit. An AND circuit 403 generates an OR of the exclusive OR signals and an out of an enable fuse circuit 404. In this case, the fuse circuit 401 and the enable fuse circuit 404 can include a fuse circuit 410 and a latch circuit 411 that holds a logical value determined by disconnecting and non-disconnecting the fuse element 410 in response to a latch pulse signal LP, as shown in FIG. 19.

What is claimed is:

1. A chip information management method for storing chip information into a semiconductor chip itself that includes a memory cell array having a plurality of memory cells, a plurality of defective address storing circuits each of which can store a defective address, and a redundant memory cell array that can replaces memory cells corresponding to defective addresses stored in the defective address storing circuits, the chip information management method comprising:
    a first step of detecting a plurality of defective addresses;
    a second step of determining a relationship between the plurality of defective addresses and the plurality of defective address storing circuits that store the defective addresses, based on the chip information to be stored; and
    a third step of storing the defective addresses in the corresponding defective address storing circuits, based on the relationship determined at the second step.

2. The chip information management method as claimed in claim 1, wherein
    at the second step, a magnitude correlation of defective addresses stored in the defective address storing circuits along a layout order is linked to the chip information to be stored.

3. The chip information management method as claimed in claim 2, wherein
    the second step is performed by determining which defective addresses are stored in which defective address storing circuits, by referring to a data table that shows a relationship between a replacement rule and corresponding information.

4. The chip information management method as claimed in claim 1, wherein
    at the first step, an address of a defective memory cell and an address of a part of memory cells having no defect are detected as the defective addresses.

5. The chip information management method as claimed in claim 4, wherein
    the part of memory cells having no defect are detected by gradually increasing a refresh cycle in an operation test of the memory cell array.

6. The chip information management method as claimed in claim 1, wherein
    at least a part of the plurality of defective address storing circuits is divided into a plurality of sub-groups, and at least two sub-groups have the same chip information.

7. The chip information management method as claimed in claim 1, wherein the chip information includes position information of the semiconductor chip on a wafer.

8. A chip information management method for obtaining chip information stored in a semiconductor chip that includes a memory cell array having a plurality of memory cells, a plurality of defective address storing circuits each of which can store a defective address, and a redundant memory cell array that can replaces memory cells corresponding to defective addresses stored in the defective address storing circuits, the chip information management method comprising:
 a first step of reading addresses stored in the plurality of defective address storing circuits by a roll call test;
 a second step of specifying a replacement rule of the redundant memory cell array, by analyzing which addresses are stored in which defective address storing circuits; and
 a third step of specifying the chip information, based on a specified replacement rule.

9. The chip information management method as claimed in claim 8, wherein
 at the second step, a replacement rule of the redundant memory cell array is specified, by analyzing a layout order of the plurality of defective address storing circuits and a magnitude correlation of stored addresses.

10. The chip information management method as claimed in claim 8, wherein
 at the third step, the chip information is specified, by referring to a data table that shows a relationship between a replacement rule of the redundant memory cell array and corresponding information.

11. The chip information management method as claimed in claim 8, wherein
 at least a part of the plurality of defective address storing circuits is divided into a plurality of sub-groups, and
 at the first step, when an address cannot be read from at least one of defective address storing circuits that constitute a predetermined sub-group, an address is read from a defective address storing circuit that constitutes other sub-group.

12. The chip information management method as claimed in claim 8, wherein
 the chip information includes position information of the semiconductor chip on a wafer.

13. A chip information management system comprising:
 a chip information obtaining unit that obtains chip information of a semiconductor chip; and
 a replacement rule determining unit that determines defective address storing circuits of the semiconductor chip into which a plurality of defective addresses included in the semiconductor chip are to be stored, wherein
 the replacement rule determining unit differentiates a magnitude correlation of defective addresses along a layout order of the plurality of defective address storing circuits, based on the chip information obtained by the chip information obtaining unit.

14. The chip information management system as claimed in claim 13, wherein
 the replacement rule determining unit determines defective address storing circuits into which a plurality of detected defective memory addresses are to be stored, by referring to a data table that shows a relationship between a replacement rule according to the redundant memory cell array within the semiconductor chip and corresponding information.

15. A chip information management system comprising:
 a roll call unit that reads defective addresses of a semiconductor chip, by a roll call test; and
 an analyzing unit that analyzes a relationship between defective addresses read out by the roll call unit and a layout order of defective address storing circuits within the semiconductor chip that stores the defective addresses, wherein
 the analyzing unit specifies chip information from the analyzed relationship, by referring to a data table that shows a relationship between a replacement rule according to the redundant memory cell array within the semiconductor chip and corresponding information.

16. A chip information management program that makes a computer execute
 a first step of obtaining chip information of a semiconductor chip, and
 a second step of determining defective address storing circuits of the semiconductor chip into which a plurality of defective addresses included in the semiconductor chip are to be stored, wherein
 at the second step, a magnitude correlation of defective addresses along a layout order of the plurality of defective address storing circuits is differentiated, based on the chip information.

17. A chip information management program that makes a computer execute
 a first step of reading addresses stored in defective address storing circuits within a semiconductor chip, by a roll call test; and
 a second step of analyzing a relationship between the addresses and a layout order of the defective address storing circuits that store the addresses, wherein
 at the second step, chip information is specified from the analyzed relationship, by referring to a data table that shows a relationship between a replacement rule according to the redundant memory cell array within the semiconductor chip and corresponding information.

* * * * *